United States Patent
Wang

(10) Patent No.: US 7,524,376 B2
(45) Date of Patent: Apr. 28, 2009

(54) METHOD AND APPARATUS FOR ALUMINUM NITRIDE MONOCRYSTAL BOULE GROWTH

(75) Inventor: Shaoping Wang, Brookfield, CT (US)

(73) Assignee: Fairfield Crystal Technology, LLC, New Milford, CT (US)

( * ) Notice: Subject to any disclaimer, the term of this patent is extended or adjusted under 35 U.S.C. 154(b) by 0 days.

(21) Appl. No.: 11/789,590

(22) Filed: Apr. 25, 2007

(65) Prior Publication Data

US 2007/0256630 A1  Nov. 8, 2007

Related U.S. Application Data

(60) Provisional application No. 60/797,470, filed on May 4, 2006.

(51) Int. Cl.
*C30B 35/00* (2006.01)

(52) U.S. Cl. .................. 117/200; 117/84; 117/85; 117/89; 117/93; 117/94; 117/100; 117/109

(58) Field of Classification Search .............. 117/84, 117/85, 89, 93, 94, 100, 109, 200
See application file for complete search history.

(56) References Cited

U.S. PATENT DOCUMENTS

| 5,858,086 | A | 1/1999 | Hunter | 117/84 |
|---|---|---|---|---|
| 5,972,109 | A | 10/1999 | Hunter | 117/204 |
| 6,045,612 | A | 4/2000 | Hunter | 117/84 |
| 6,063,185 | A | 5/2000 | Hunter | 117/84 |
| 6,086,672 | A | 7/2000 | Hunter | 117/84 |
| 6,296,956 | B1 | 10/2001 | Hunter | 428/698 |
| 6,770,135 | B2 | 8/2004 | Schowalter et al. | 117/106 |
| 7,052,546 | B1 * | 5/2006 | Motakef et al. | 117/84 |
| 7,056,383 | B2 | 6/2006 | Helava et al. | 117/103 |
| 7,361,222 | B2 * | 4/2008 | Janzen et al. | 117/103 |
| 2002/0170490 | A1 | 11/2002 | Vodakov et al. | 117/106 |
| 2003/0127044 | A1 | 7/2003 | Schowalter et al. | 117/106 |

OTHER PUBLICATIONS

U.S. Appl. No. 11/438,575, filed May 2006, Wang.
Slack et al., Growth of High Purity AlN Crystals, *Journal of Crystal Growth*, vol. 34, pp. 263-279, 1976.

(Continued)

*Primary Examiner*—Felisa C Hiteshew
(74) *Attorney, Agent, or Firm*—Michaud-Duffy Group LLP

(57) ABSTRACT

A crystal growth setup within a physical vapor transport growth furnace system for producing AlN monocrystal boules at high temperatures includes a crucible effective to contain an AlN source material and a growing AlN crystal boule. This crucible has a thin wall thickness in at least that portion housing the growing AlN crystal boule. Other components include a susceptor, in case of an inductive heating, or a heater, in case of a resistive heating, a thermal insulation enclosing the susceptor or heater effective to provide a thermal gradient inside the crucible in the range of 5-100° C./cm and a furnace chamber capable of being operated from a vacuum (<0.1 torr) to a gas pressure of at least 4000 torr through filling or flowing a nitrogen gas or a mixture of nitrogen gas and argon gas. The high temperatures contribute to a high boule growth rate and the thin wall thickness contributes to reduced imparted stress during boule removal.

2 Claims, 15 Drawing Sheets

OTHER PUBLICATIONS

Slack et al., AlN Single Crystals, *Journal of Crystal Growth*, vol. 42, pp. 560-563, 1977.
Dryburgh, The Estimation of Maximum Growth Rate for Aluminum Nitride Crystals Grown by Direct Sublimation, *Journal of Crystal Growth*, vol. 125, pp. 65-68, 1992.
Segal et al., On Mechanisms of Sublimation Growth of AlN Bulk Crystals, *Journal of Crystal Growth*, vol. 211, pp. 68-72, 2000.
Epelbaum et al., Sublimation Growth of Bulk AlN Crystals: Process Temperature and Growth Rate, *Trans Tech Publications*, 2004.

* cited by examiner

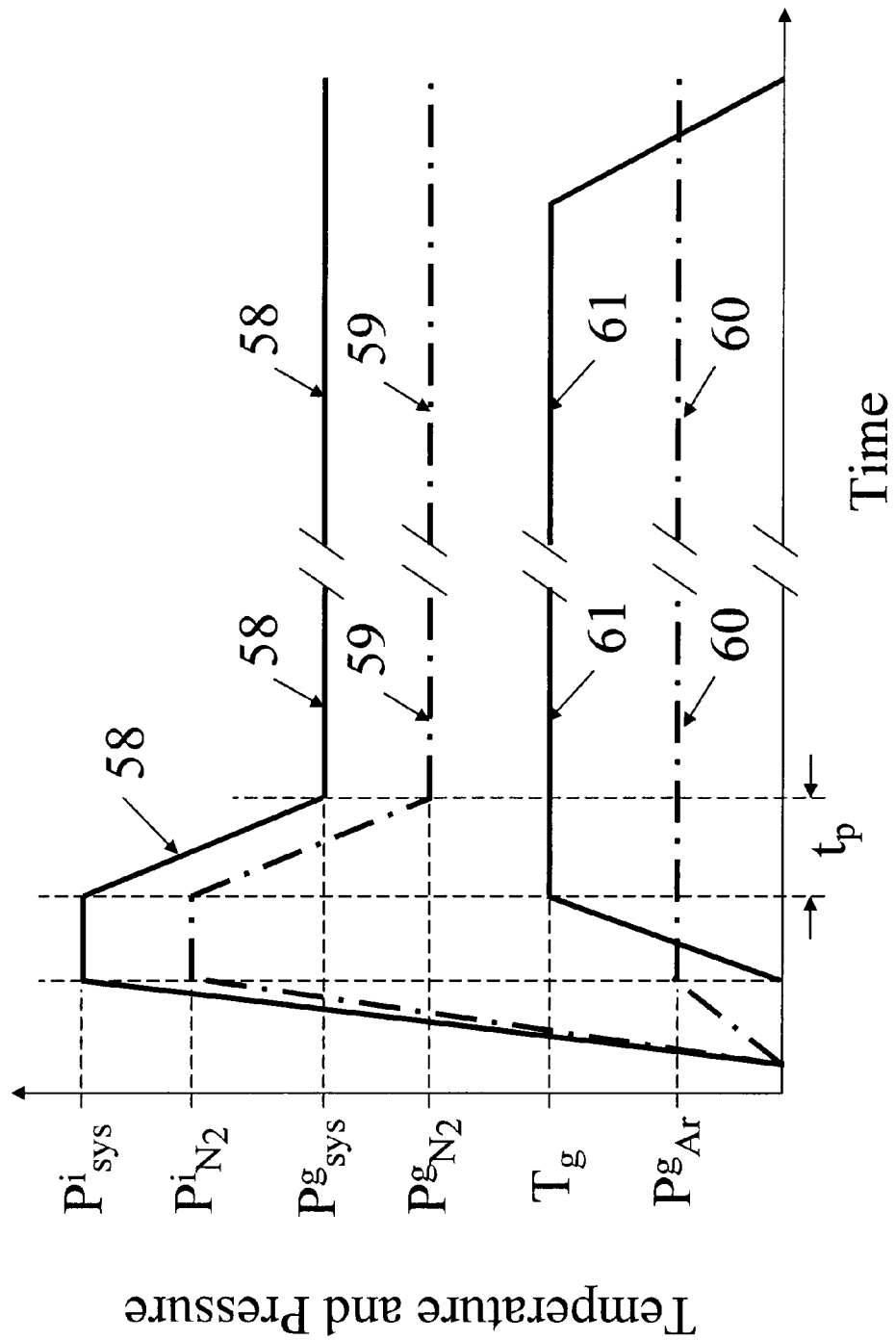

METHOD AND APPARATUS FOR ALUMINUM NITRIDE MONOCRYSTAL BOULE GROWTH

CROSS REFERENCE TO RELATED APPLICATION(S)

This patent application claims priority to U.S. Provisional Patent Application Ser. No. 60/797,470 titled "Method and Apparatus for Aluminum Nitride Monocrystal Boule Growth" that was filed on May 4, 2006. Provisional Patent Application Ser. No. 60/797,470 is incorporated by reference in its entirety herein.

U.S. GOVERNMENT RIGHTS

The invention was made with U.S. Government support under SBIR Contract DE-FG02-05ER84232 awarded by the Department of Energy. The U.S. Government has certain rights in the invention.

BACKGROUND OF THE INVENTION

1. Field of the Invention

This invention relates to a method and an apparatus for growing aluminum nitride (AlN) single crystal boules. More particularly, AlN single crystals are grown in a crucible made from a refractory metal (tantalum or niobium) or metal carbide (tantalum carbide or niobium carbide), or metal nitride (tantalum nitride or niobium nitride) or a composite of refractory metal, metal carbide, and metal nitride. The crucible portion in contact with the AlN crystal boule growing inside the crucible has a thickness nominally in the range of 0.05-2.0 mm and preferably in the range of 0.1-1.0 mm. In one aspect of the invention, the crucible is heated inductively or resistively. The induction susceptor (heat receiver), in the case of an inductively heated furnace, or a heater, in the case of a resistively heated furnace, and the thermal insulation are made from graphite-based or non-graphite-based materials. AlN single crystal boules are grown in the growth setup by sublimation physical vapor transport at an elevated temperature, nominally in the range of 2000-2500° C., more preferably in the range of 2150-2450° C. In other embodiments, the pressure inside the growth vessel during crystal growth is maintained by filling or flowing nitrogen and argon gases and the partial pressures of nitrogen and argon gases are maintained nominally in the ranges of 300 to 2000 torr and 0 to 800 torr, respectively, and a total system pressure maintained in the range of 300 torr to 2800 torr.

2. Description of the Related Art

Concepts related to AlN sublimation physical vapor transport (referred to as PVT hereinafter) growth are briefly reviewed. A sublimation physical vapor transport growth technique for AlN crystals is essentially a sublimation and re-condensation process, in which an AlN source material placed in a crucible (container) is sublimed into a mixture of nitrogen ($N_2$) gas and aluminum (Al) vapor at high temperatures, usually higher than 1800° C., and the vapor species then diffuses to the cooler end of the crucible to recombine and form AlN crystals. If the vapor phase resulting from sublimation of AlN solids has a nitrogen to aluminum molar ratio, i.e. the number of $N_2$ molecules to the number of Al molecules, of exactly 1 to 2 (i.e. 0.5), the vapor phase is stoichiometric. When the ideal gas law is applied, the ratio of $N_2$ partial pressure to Al vapor partial pressure in a stoichiometric vapor, and the corresponding partial pressures of the nitrogen gas and the aluminum vapor are called stoichiometric partial pressures. AlN sublimed in a sealed and gas-tight container with no prior nitrogen gas or aluminum metal placed in it produces a stoichiometric vapor. The vapor phase can also be made to deviate from stoichiometry. The vapor phase is called nitrogen-rich vapor when the nitrogen gas to aluminum molar ratio is larger than 1 to 2, and the vapor phase is called aluminum-rich when the nitrogen gas to aluminum molar ratio is smaller than 1 to 2.

PVT AlN growth can be carried out in a crucible that is capable of communicating with the environment outside of the crucible, and examples of communicating crucibles include a substantially open crucible allowing nitrogen gas and aluminum vapor to go in or out the crucible, and a substantially sealed crucible preventing excessive loss of aluminum vapor and allowing nitrogen to diffuse through the seal to the extent that the total pressure inside and outside the crucible is substantially the same. Using a communicating crucible in a PVT growth is advantageous, compared to a sealed crucible, because, by controlling the system nitrogen pressure inside the furnace, the stoichiometry of the vapor phase can be set or controlled to any desired stoichiometry, whether it is stoichiometric, or nitrogen-rich, or aluminum-rich, in-situ during a growth. More specifically, at a given source material temperature in a PVT growth, the system nitrogen pressure can be set to a value so that the nitrogen partial pressure inside the growth crucible equals the stoichiometric nitrogen partial pressure so that a substantially stoichiometric vapor is obtained. Similarly, at a given source material temperature in a PVT growth, the system nitrogen pressure can also be set to a value so that the nitrogen partial pressure inside the growth crucible is higher than the stoichiometric nitrogen partial pressure so that a nitrogen-rich vapor is obtained. Moreover, at a given source material temperature in a PVT growth, the system nitrogen pressure can also be set to a value so that the nitrogen partial pressure inside the growth crucible is lower than the stoichiometric nitrogen partial pressure so that an aluminum-rich vapor is obtained.

In a PVT AlN growth, adding inert gas, such as argon, into the crucible will not change the nitrogen to aluminum molar ratio in the vapor phase, but may slow down diffusion transport of the vapor species and hence may reduce growth rate. Adding argon gas into a PVT growth furnace may significantly decrease degradation of PVT furnace parts, including heater and thermal insulation, exposing to high temperatures during PVT growths and therefore increase their useful lifetime.

Growth of bulk AlN single crystal boules using a sublimation physical vapor transport technique was demonstrated by Slack & McNelly (G. A. Slack and T. McNelly, "Growth of High Purity AlN Crystals", J. Cryst. Growth, 34 (1976), and G. A. Slack and T. McNelly, "AlN Single Crystals", J. Cryst. Growth, 42 (1977), referred to as Slack's work hereinafter). Slack's work teaches a use of thin wall tungsten crucibles. Slack's work yielded polycrystalline AlN crystals but the crystal growth rates were rather low, usually about 0.3 mm per hour. Slack's work also disclosed that the thin wall tungsten crucibles used in the PVT growth experiments suffered from leakage of aluminum vapor leading to crucible failure during growth, which limited AlN crystal boules to small usable lengths (usually less than 10 mm).

For volume production of AlN crystals, a growth rate higher than 0.3 mm/hr in PVT AlN growth is desirable because the higher the growth rate is, the more productive and economical the boule growth process is. A longer lifetime of crucibles is highly desirable because it permits growth of longer boules yielding more crystal substrates per boule. To develop a reliable and efficient physical vapor transport growth technique for volume production of AlN single crystal substrates, a number of researchers and artisans made attempts to improve PVT growth technique for AlN crystals over the technique disclosed in Slack's work.

Growth rate in sublimation PVT growth of AlN was modeled and studied theoretically by Dryburgh (P. M. Dryburgh, "The Estimate of Maximum Growth Rate for Aluminum Nitride Crystals Grown by Direct Sublimation", J. Cryst. Growth, 125 (1992), referred to as Dryburgh's model). Dryburgh's model deals with a sublimation growth from a stoichiometric vapor. Dryburgh's model predicts that the growth rate of AlN crystal increases as the crystal temperature increases when the temperature difference between the source material and growing crystal, and the system nitrogen pressure are held constant.

Segal, et al., (A. S. Segal, S. Yu. Karpov, Yu. N. Makarov, E. N. Mokhov, A. D. Roenkov, M. G. Ramm, and Yu. A. Vodakov, "On Mechanisms of Sublimation Growth of AlN Bulk Crystals", J. Cryst. Growth, 211 (2000), referred to as Segal's work, hereinafter) studied PVT AlN growth both theoretically and experimentally. Segal's work further deals with PVT AlN growth from both a stoichiometric vapor phase and a non-stoichiometric vapor phase. Segal's work further predicts that for a given set of temperatures of the source material and the growing crystal, the crystal growth rate depends on the stoichiometry of the vapor phase in the following manner: the growth rate reaches its maximum when the vapor phase is close to stoichiometric, and the growth rate decreases as the nitrogen partial pressure increases above the stoichiometric nitrogen partial pressure, i.e. from a nitrogen-rich vapor, and the growth rate also decreases when the nitrogen partial pressure in the vapor phase is lower than the stoichiometric nitrogen partial pressure, i.e. from an aluminum-rich vapor. Segal's work teaches use of an open crucible so that a wide range of nitrogen-to-aluminum molecular ratios in the vapor phase inside the crucible can be achieved by controlling the system nitrogen pressure exterior to the crucible. However, compared to a sealed crucible used in Slack's work, use of an open crucible has two major disadvantages: (1) a large amount of aluminum vapor is wasted, and (2) the excess aluminum vapor escaped from the crucible would reacts and degrades or even destroys the heater/susceptor and thermal insulation in the growth furnace.

Hunter's patents (U.S. Pat. Nos. 5,858,086; 5,972,109; 6,045,612; 6,063,185; 6,086,672; and 6,296,956) describe various growth setup schemes for PVT AlN growth. The patents disclose crucibles made from graphite, silicon carbide coated graphite, aluminum oxide, zirconium oxide and boron nitride. Crucibles made from these materials are typically rendered unusable at growth temperatures higher than about 2000° C., due to severe chemical reaction of these crucible materials with aluminum vapor or because of the low melting points of some of these crucible materials.

U.S. Pat. No. 6,770,135 to Scholwater, et al., discloses a growth apparatus and a growth method for AlN single crystal boule growth with: (i) a substantially sealed crucible made of metallurgical tungsten, (ii) a thermal insulation made of a combination of tungsten and BN (or other non-graphite-based thermal insulation materials), (iii) a gas mixture of $H_2$ (no more than 5%), $N_2$ and Ar gases at a super-atmospheric pressure (>1 atm, or 760 torr) inside the growth vessel and the crucible, and (iv) the crystal growth initiated and maintained by traversing the crucible with respect to the heater and thermal insulation.

Although the use of a substantially sealed tungsten crucible preventing excessive leakage of aluminum vapor from the crucible leads to a better usage of the AlN source material and a higher growth rate, the crystal boules are grown inside a tungsten crucible in a manner that the crystal boules adhere to the walls of the tungsten crucible. This poses at least two problems: (1) difficult crystal boule retrieval—because the AlN crystal boules adhere to the walls of the tungsten crucibles, retrieval of the AlN crystal boules from the crucibles is difficult and may also cause stresses and even cracks in the crystal boules; and (2) high thermal-mechanical stresses in the crystals—because the thermal expansion coefficient of metallurgical tungsten metal is smaller than AlN crystals, the grown AlN crystal boules cooled down from growth temperature to the room temperature will be under a tensile stress, which will cause stresses and even cracks in the AlN crystals boules. These problems may be partially alleviated if a thin wall tungsten crucible is used and the wall thickness in the crucible portion adhering to the AlN crystal boule is significantly smaller than 2 mm. Crucibles made from metallurgical tungsten (the most commonly produced tungsten metal) are extremely brittle, and hence machining, or otherwise making, a tungsten crucible with a wall thickness significantly less than about 2 mm is difficult. Furthermore, a tungsten crucible of a regular wall thickness (about 2 mm or larger) is already prone to cracking arising from the "swelling effect" due to infiltration of aluminum vapor into the tungsten crucible from the inside surfaces of the tungsten crucibles in contact with the vapor phase during a PVT AlN growth, as disclosed in US Patent Application Pub. No. US 2003/0127044, Schowalter, et al.), and a tungsten crucible with a thin wall significantly less than about 2 mm will have too short a lifetime to produce AlN crystals of useful lengths, as found in Slack's work.

In Schowater's patent, since growth initiation and continuation are achieved by traversing the crucible relative to the thermal gradient, control of crystal growth rate is complicated by a constant change of thermal profile within the growth crucible and the variation of the growth rate within a growth run may affect the quality of the crystal boules. In addition, the constant change of thermal profile inside the crucible can cause a constant change of the shape of the interface between a growing crystal boule and the adjacent vapor phase, and such a change of growth interface shape from convex (towards the vapor phase) to concave can cause unfavorable nucleation and growth on the crucible wall leading to a defective crystal boule or a polycrystalline boule.

Epelbaum, et al., (B. M. Epelbaum, M. Bickermann and A. Winnacker, "Sublimation Growth of Bulk AlN Crystals: Process Temperature and Growth Rate", Materials Science Forum, Vols. 457-460 (2004), referred to as Epelbaum's work hereinafter) teaches open tungsten crucibles heated by a tungsten resistive heater in a PVT AlN growth process. The open crucibles used in Epelbaum's work have the same disadvantages as in Segal's work. Epelbaum's work demonstrated a growth rate of 0.3-1.0 mm/hr, but the poor integrity of the tungsten crucibles at high growth temperatures (>2150° C.), presumably due to the "swelling effect", was also found to limit the crystal boule length.

Zhuang, et al., (Dejin Zhuang, Raoul Schlesser and Zlatko Sitar), "Crystal Expansion and Subsequent Seeded Growth of AlN Single Crystals", Mater. Res. Soc. Symp. Vol. 831(2005); and (D. Zhuang, Z. G. Herro, R. Schlesser, and Z. Sitar), "Seeded Growth of AlN Single Crystals by Physical Vapor Transport", J. Cryst. Growth 287 (2006), referred to hereafter as Zhuang's work, disclose an open crucible made of tungsten in a graphite-based susceptor and thermal insulation system within an inductively heated furnace. Disadvantageously, the growth technique in Zhuang's work suffers from the same drawbacks of open crucibles made of tungsten metal.

U.S. Pat. No. 7,056,383, referred to as Heleva's patent hereinafter, discloses a use of tantalum nitride (TaN)-based crucibles converted from a tantalum crucible in a graphite-based or a non-graphite based PVT furnace for AlN crystal growth. Disadvantageously, Heleva's patent teaches a use of open crucibles in PVT AlN growth that suffers from the same drawbacks as previously described in growths using open crucibles made of tungsten.

Therefore, in order to efficiently produce high quality AlN single crystals suitable for making substrates for group III-nitride device fabrication, there remains a need of a PVT AlN crystal growth technique that overcomes the deficiencies in the prior art.

BRIEF SUMMARY OF THE INVENTION

The details of one or more embodiments of the invention are set forth in the accompanying drawings and the description below. Other features, objects and advantages of the invention will be apparent from the description and drawings, and from the claims. A crystal growth setup within a physical vapor transport growth furnace system for producing AlN monocrystal boules at high temperatures includes a crucible effective to contain an AlN source material and a growing AlN crystal boule. This crucible has a thin wall thickness in at least that portion housing the growing AlN crystal boule. Other components include a susceptor, in case of an inductive heating, or a heater, in case of a resistive heating, a thermal insulation enclosing the susceptor or heater effective to provide a thermal gradient inside the crucible in the range of 5-100° C./cm and a furnace chamber capable of being operated from a vacuum (<0.1 torr) to a gas pressure of at least 4000 torr through filling or flowing a nitrogen gas or a mixture of nitrogen gas and argon gas. The high temperatures contribute to a high boule growth rate and the thin wall thickness contributes to reduced imparted stress during boule removal.

BRIEF DESCRIPTION OF THE DRAWINGS

FIG. 15 is a schematic chart showing select growth parameters used in the instant process when a pressure ramp is used in growth initiation.

Like reference numbers and designations in the various drawings indicated like elements.

DETAILED DESCRIPTION

Figure 1:
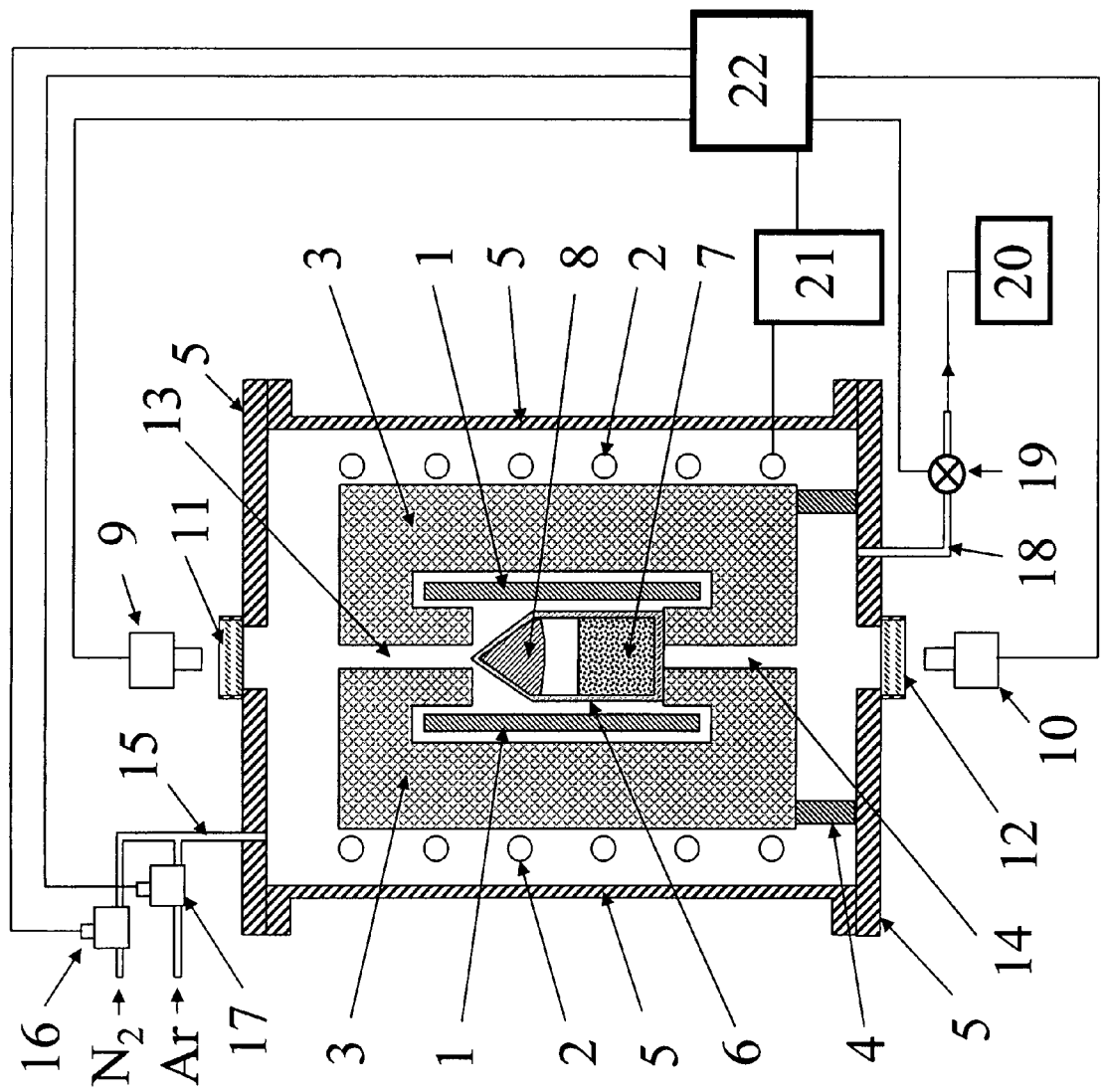
FIG. 1 is a cross sectional view of a sublimation physical vapor transport furnace for growth of AlN single crystals.

Group III nitride-based (GaN, AlGaN, InGaN and AlInGaN) semiconductor devices are important for many current and future applications, such as solid-state lighting, high-density data recording, wireless communication, radar, detection of chemical and biological agents and UV water purification. Due to unavailability of large diameter native Group III-nitride (GaN and AlN) bulk single crystal substrates, III-V nitride-based devices, such as blue (high brightness) HB-LEDs and laser diodes are mainly fabricated from thin films grown on non-native (sapphire or SiC) substrates. Both sapphire and SiC have significant crystal lattice mismatches to GaN and other Group III nitride thin films. More importantly the crystal structures of sapphire and SiC are different from that of GaN and III-nitride alloys. These factors contribute to the poor crystal quality of III-nitride epitaxial thin films grown essentially on foreign substrates and the dislocation densities in such thin films are very high, usually in a range of $10^9$-$10^{10}$ cm$^{-2}$, which adversely affect device performance and lifetime. By using high quality AlN bulk single crystals as substrates, III-nitride thin films with a low dislocation density (less than $10^6$ cm$^{-2}$) can be produced and hence III-nitride-based devices of high performance and long lifetime can be fabricated. AlN single crystals can be used as substrates for fabricating III-nitride-based (GaN, AlGaN, InGaN and AlInGaN) semiconductor devices, including but not limited to blue and UV light emitting diodes (LEDs), white LEDs, blue and UV lasers, UV photodetectors, high frequency devices, high power devices, high temperature devices, spintronics devices, surface acoustic wave (SAW) devices and integrated circuits (ICs).

Since AlN sublimes at high temperatures (1800° C. or higher), AlN bulk single crystals may be grown using sublimation physical vapor transport technique.

An apparatus for the growth of bulk AlN single crystals includes a housing defining the growth chamber. The chamber includes a gas inlet for filling or flowing gases into the chamber, and a gas outlet for evacuating the chamber to vacuum or venting gases from the chamber, at least one viewing port configured for measuring or monitoring of crystal growth temperature within the growth chamber. An induction coil and a radio frequency power supply are used in conjunction with a susceptor (heat receiver) made of high purity solid graphite material to provide heat in the growth chamber (i.e. an inductively heated furnace). Alternatively, heat in the growth chamber can be provided by a resistive heater made of high purity solid graphite in conjunction with an alternating current (AC) power supply (i.e. a resistively heated furnace). Inside the chamber, a thermal insulation made of graphite-fiber-based materials or a graphite/carbon powder is disposed coaxially with the coil and the susceptor when inductively heated or the resistive heater when resistively heated, and the thermal insulation encloses the susceptor when inductively heated or the resistive heater when resistively heated. A crucible (container) defining the crystal growth enclosure is disposed coaxially with the susceptor, or the resistive heater, and the crucible is enclosed by the thermal insulation.

The crucible has two ends: a first end of the crucible and the portion including this first end are configured for housing a growing AlN crystal. An opposing second end of the crucible and the portion including this second end are configured for housing an AlN source material. The crucible contains at least one nucleation site in the first end and an AlN source material in the portion including the second end so that a PVT growth of AlN crystals is carried out through self-seeding. The crucible contains an AlN source material in the crucible second end portion and an AlN crystal seed placed at the first end when a PVT growth of AlN crystal is carried out through seeded growth using an AlN crystal seed.

The thermal insulation contains one opening close to the crucible first end to provide an axial thermal gradient in a range of 3° C./cm to 200° C./cm within the crucible cavity, and the same opening in thermal insulation is also used as a viewing channel through which the temperature of the crucible first end as part of the crucible portion housing the growing crystal is measured or monitored using an optical pyrometer. The thermal insulation may contain a separate opening in the portion close to the crucible second end as part of the crucible portion housing an AlN source material and this opening is used as a viewing channel through which the temperature of the crucible second end as part of the crucible portion housing the AlN source material is measured or monitored using another optical pyrometer.

The apparatus is made in such way that the crucible inside the growth chamber can be heated to and maintained at a temperature of at least 2500° C. The pressure inside the growth chamber can be maintained at a pressure of at least 4000 torr (about 5 atm) by flowing or filling with a high purity nitrogen gas or a mixture of a high purity nitrogen gas (of at least 99.99%) and a high purity argon gas (of at least 99.99%).

The crucible is made from a refractory metal, such as tantalum (Ta) or niobium (Nb), of at least 99.9% purity. The crucible is mechanically shaped or formed such as by, but not limited to, machining, welding, punching, deep drawing, forging, turning, milling, grinding, and polishing. The crucible is shaped or otherwise made in such way that the portion of the crucible including the first end for housing the growing AlN crystal has a thickness nominally in the range of 0.05 to 2 mm, more preferably in the range of 0.1 to 1 mm. The crucible is shaped in such way that the crucible first end as part of the crucible portion for housing the growing AlN crystal has a conical shape for crystal growth through self-seeding. The crucible is shaped or otherwise configured in such way that the crucible first end as part of the crucible portion for housing the growing AlN crystal can hold an AlN crystal seed for a crystal growth through seeding using at least one AlN crystal seed.

The crucible is shaped or otherwise made in such way that the second end portion for housing an AlN source material has an opening for placing an AlN crystal seed into the crucible at the crucible end as part of the crucible portion for housing the growing crystal, and filling AlN source material into the crucible to the portion for housing an AlN source material so that a growth through seeding with an AlN crystal seed may be carried out. The crucible is made in such way that the crucible is substantially sealed using a mechanical seal at the second end so that excess loss of aluminum vapor from the crucible through the mechanical seal is minimized but in the meantime nitrogen gas is able to diffuse through the mechanical seal so as to maintain substantially the same pressure in the interior and the exterior of the crucible (the crystal growth enclosure).

In one embodiment, the source material is a crystalline AlN material in a form such as free-flowing powder, aggregated powder, dense solid chunks, or one solid or multiple solid pieces. Alternately, the source material is a high purity aluminum metal of at least 99.9% to provide aluminum vapor and a nitrogen gas of at least 99.99% purity inside the crystal growth crucible.

Another aspect is that at least one nucleation site is provided for PVT AlN single crystal growth. The nucleation site is the interior surface of a conical first end of a crucible when self-seeding is employed to grow AlN single crystals. The nucleation site is one or more AlN single crystal seeds when an AlN-seeded growth in employed to grow AlN single crystals.

Another aspect is using an argon gas in a PVT growth furnace to decrease degradation of PVT furnace parts, including heater and thermal insulation, exposed to high temperatures during PVT growths, and therefore to increase the usable lifetime of the components.

A method for growing bulk single crystals of aluminum nitride includes utilizing the aforementioned setup in a PVT growth furnace and the crucible for housing the source material and a growing AlN crystal. This method includes the following steps:

a.) providing at least one nucleation site in a first end of a crucible and placing a source material at an opposing second end of the crucible with the nucleation site and the source material separated by a distance;

b.) evacuating the growth vessel to a pressure less than 0.1 torr, c.) ramping up the system pressure and the crucible temperature to initiate crystal growth by following a predetermined growth initiation procedure so that, at the end of the growth initiation, the system pressure in the growth chamber is $P^g_{system}$ comprised of nitrogen and argon partial pressures, $P^g_{nitrogen}$ and $P^g_{argon}$ ($P^g_{system} = P^g_{nitrogen} + P^g_{argon}$) by filling or flowing nitrogen and argon gases, the temperature of the source material is at $T^g_{source}$, and the temperature of the nucleation site is at $T^g_{nucleation}$, and $T^g_{source}$ is larger than $T^g_{nucleation}$;

d.) maintaining a substantially constant system pressure, $P^g_{system}$, comprised of nitrogen and argon partial pressures, $P^g_{nitrogen}$ and $P^g_{argon}$ ($P^g_{system} = P^g_{nitrogen} + P^g_{argon}$) by filling or flowing nitrogen and argon gases;

e.) maintaining a temperature distribution within the crucible enclosure in such a way that the temperature of the source material, $T_{source}$, is higher than the temperature of the crystal surface of the growing AlN single crystal facing the source material, thereby causing continuing growth of AlN single crystals; and f.) cooling the furnace to room temperature.

The growth initiation in Step c.) is as follows: ramping the system pressure to $P^g_{system}$ in a period of time of about 0.5 to 2 hours and then heating the crucible so that the temperature of the source material reaches $T^g_{source}$ and the temperature of the nucleation site reaches $T^g_{nucleation}$, where $T^g_{source}$ is higher than $T^g_{nucleation}$, in a time period in the range of about 3 hours to 10 hours while maintaining the system pressure substantially constant at $P^g_{system}$ that substantial growth of AlN crystals on the nucleation site or sites is initiated.

Alternately, the growth initiation in Step c.) is as follows: ramping the system pressure to $P^i_{system}$ ($P^i_{system}$ is at least 100 torr higher than $P^g_{system}$) in a period of time of about 0.5 to 2 hours, and heating the crucible so that the temperature of the source material reaches $T^g_{source}$ and the temperature of the nucleation site reaches $T^g_{nucleation}$, where $T^g_{source}$ is higher than $T^g_{nucleation}$, in a time period in the range of about 2 hours to about 4 hours while maintaining the system pressure substantially constant at $P^i_{system}$, and then decreasing the system pressure from $P^i_{system}$ to a value of $P^g_{system}$ in a time period of 2 to 8 hours so that substantial growth of AlN crystals on the nucleation site or sites is initiated.

The aforementioned system pressure $P^g_{system}$ is in the range of about 300 torr to 2800 torr and $P^i_{system}$ is in the range of about 400 torr to 2900 torr. The system pressure in a PVT growth furnace consists of a nitrogen partial pressure, $P_{nitrogen}$, and argon pressure, $P_{argon}$, and $P_{system}=P_{nitrogen}+P_{argon}$. Therefore, the partial pressures of nitrogen and argon corresponding to $P^g_{system}$ and $P^i_{system}$ are in the ranges as follows:

$P^g_{nitrogen}$ is about 300 torr to 2000 torr, and $P^g_{Argon}$ is about 0 torr to 800 torr;

$P^i_{nitrogen}$ is about 400 torr to 2100 torr, and $P^g_{Argon}$ is about 0 torr to 800 torr;

and the Ar gas is used to reduce degradation of graphite parts inside the growth furnace and hence to increase lifetime of the graphite parts.

The aforementioned growth temperatures are as follows:

$T^g_{source}$ is nominally in the range of 2000-2500° C., more preferably in the range of 2150-2450° C.

$T^g_{nucleation}$ is nominally in the range of 2000-2500° C., more preferably in the range of 2150-2450° C.

$T^g_{source}$ is larger than $T^g_{nucleation}$ by the amount nominally in the range of about 3° C. to 300° C., more preferably in the range of about 10° C. to 200° C.

Another aspect is that a PVT AlN single crystal is grown from a vapor phase that is nitrogen-rich, or substantially stoichiometric, or aluminum-rich. An average growth rate in a PVT AlN crystal growth in accordance with the invention is in the range of about 0.3 mm/hr to 2.5 mm/hr.

Another aspect is that the aforementioned crucible made of Ta metal is further treated before being used in PVT growth of AlN crystal so that at least one surface layer contains TaC formed by a high temperature carbonization process in a graphite-based furnace (i.e. with a graphite susceptor/heater and graphite thermal insulation). The high temperature carbonization process includes the following steps: (1) evacuating the furnace vessel to a system pressure of lower than 0.1 torr, (2) maintaining a furnace system pressure in the range of 100 torr to 760 torr by filling or flowing nitrogen gas, (3) heating an empty Ta crucible when only the exterior surface of the crucible is to be carbonized, or a Ta crucible filled with graphite chunks of sizes in the range of 1 mm to 5 mm when both exterior and interior surfaces are to be carbonized, to a crucible temperature in the range of 2200-2400° C. in about 3 to 6 hours, and maintaining the crucible temperature constant in the range of 2200-2400° C. for about 2 to 8 hours, and (4) cooling the furnace to room temperature. After the carbonization treatment, a TaC layer of golden yellow appearance is on the exterior surface of the crucible or on both the exterior and interior surfaces of the crucible or the entire crucible is converted into TaC. The crucible shape and physical dimensions are substantially unchanged before and after the carbonization process. The crucible after being treated in a carbonization process is used in AlN PVT growth in substantially the same way as a Ta crucible without being carbonized. A crucible made of Nb is treated in substantially the same carbonization process so that at least one surface layer of the crucible contains NbC.

Another aspect is that the aforementioned crucible made of Ta metal is further treated so that at least one surface layer of the crucible contains TaN in a high temperature nitridation process in a non-graphite-based furnace (with graphite-free or carbon-free susceptor/heater and thermal insulation). The high temperature nitridation process includes the following steps: (1) evacuating the furnace vessel to a system pressure of lower than 0.1 torr, (2) maintaining a furnace system pressure in the range of 100 torr to 760 torr by filling or flowing nitrogen gas, (3) heating an empty Ta crucible to a crucible temperature in the range of 2200-2400° C. in about 3 to 6 hours, and maintaining the crucible temperature constant in the range of 2200-2400° C. for about 2 to 8 hours, and (4) cooling the furnace to room temperature. After the nitridation treatment, a TaN layer is on both the exterior and interior surfaces of the crucible or the entire crucible is converted into TaN. The crucible shape and physical dimensions are substantially unchanged before and after the nitridation process. The crucible containing TaN after being treated in the nitridation process is used in AlN PVT growth in substantially the same way as a Ta crucible without being treated in the nitridation process. A crucible made of Nb is treated in substantially the same nitridation process so that at least one surface layer of the crucible contains NbN.

Another aspect is that AlN single crystal boules grown inside thin wall crucibles as described above are substantially free from stresses and can be retrieved substantially without stresses and cracks induced during the boule retrieval process.

Another aspect is that the thermal insulation may be modified, and the crucible may be placed on a movable platform in such way that the crucible can be traversed upward or downward in a vertical furnace, or left or right in a horizontal furnace through a thermal gradient. In connection with this aspect, crystal growth can be initiated and maintained by traversing the crucible with respect to the susceptor (heater) and thermal insulation through a thermal gradient in a PVT growth furnace.

Another aspect is that an $Al_xGa_{1-x}N$ bulk single crystal, where the value of x is in the range of 0.1 to 1.0, is grown using substantially the same aforementioned growth setup, crucible and growth procedure.

This invention discloses an apparatus and a method for making aluminum nitride (AlN) single crystal boules that can be further made into AlN substrates. The AlN bulk single crystal substrates can be used for growth of III-nitride (GaN, AlGaN, InGaN and AlInGaN) thin films with low dislocation densities (less than $10^6$ $cm^{-2}$) and hence III-nitride-based devices of high performance and high lifetime can be fabricated. AlN single crystals can be used as substrates for fabricating III-nitride-based (GaN, AlGaN, InGaN and AlInGaN) semiconductor devices, including but not limited to blue and UV light emitting diodes (LEDs), white LEDs, blue and UV lasers, UV photodetectors, high frequency devices, high power devices, high temperature devices, spintronics devices, surface acoustic wave (SAW) devices and integrated circuits (ICs).

This invention discloses an apparatus and a method for growing aluminum nitride (AlN) single crystal boules using a sublimation physical vapor transport (PVT) technique. A sublimation PVT growth technique for AlN crystals is essentially a sublimation and re-condensation process, in which an AlN source material placed in a crucible (the growth enclosure) is heated to a high temperature, usually higher than 1800° C., and sublimes into a mixture of nitrogen ($N_2$) gas and aluminum (Al) vapor. The vapor then diffuses to the cooler end of the crucible to recombine and form AlN crystals.

In accordance with a first embodiment, FIG. 1 is a cross sectional view of a sublimation physical vapor transport furnace for growth of AlN single crystals. Components include: induction susceptor (heater receiver, referred to as susceptor hereinafter), 1, induction coil, 2, thermal insulation, 3, support for thermal insulation, 4, furnace enclosure, 5, crucible (defining growth enclosure), 6, source material, 7, growing crystal boule, 8, optical pyrometer at the top, 9, optical pyrometer at the bottom, 10, top pyrometer view port, 11, bottom pyrometer view port, 12, top pyrometer view channel in thermal insulation, 13, bottom pyrometer view channel in thermal insulation, 14, gas inlet for nitrogen and argon gas, 15, mass flow controller for nitrogen gas, 16, mass flow controller for argon gas, 17, exhaust line, 18, electromagnetic valve, 19, vacuum pump, 20, radio frequency (RF) power supply, 21, control console (including temperature and pressure controllers, and a computer), 22. It is understood by one who is skilled in the art that heating in the growth furnace via susceptor, 1, induction coil, 2, and RF power supply, 21, (i.e. an inductive heating), can be alternatively provided via a resistive heater (in place of susceptor, 1,) and an alternating current (AC) power supply (in place of RF power supply, 21,) (i.e. a resistive heating), without induction coil, 2. The apparatus is configured in such way that it is capable of operation at a crucible temperature of at least 2500° C. and at a system from a vacuum (less than 0.1 torr) to a pressure of at least 4000 torr.

Another aspect of this first embodiment is that the materials used for making the susceptor/heater and the thermal insulation are graphite-based materials: susceptor (or heater in a resistive heated furnace) 1 is made of a graphite solid with an ash content of nominally less than 50 ppm, more preferably less than 10 ppm; and thermal insulation 3 is made of a graphite-based insulation material including but not limited to rigid graphite-fiber insulation material, flexible graphite-fiber insulation material, graphite powder, carbon black powder, with an ash content of nominally less than 100 ppm, more preferably less than 50 ppm.

Another aspect is that the source material 7 is a crystalline AlN material in a form such as free-flowing powder, aggregated powder, dense solid chunks, or one solid or multiple solid pieces. Alternately, the source material is a high purity aluminum metal of at least 99.9% to provide aluminum vapor and a high purity nitrogen gas of at least 99.99% purity inside the crystal growth crucible.

Figure 2:
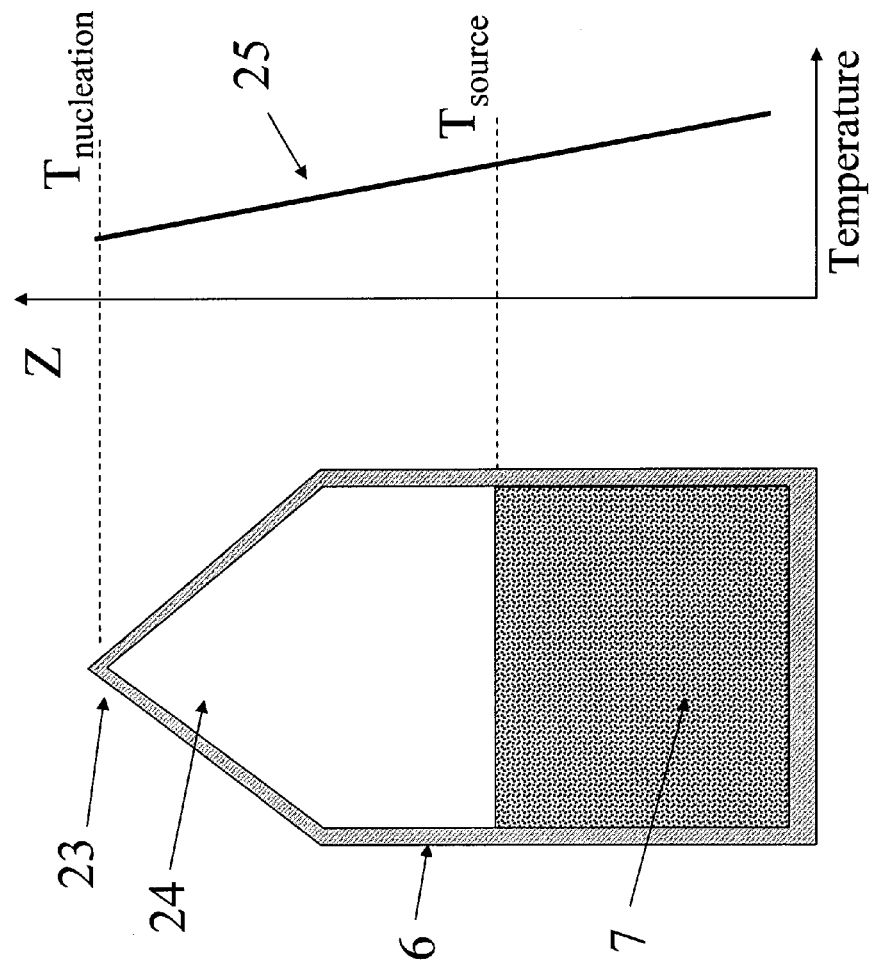
FIG. 2 is a schematic drawing showing axial temperature distribution within a crucible in a sublimation growth furnace.

Another aspect in accordance with this first embodiment is that the crucible 6 has two ends: a first end of the crucible and the portion including this first end is configured for housing a growing AlN crystal 8 and an opposing second end is configured for housing an AlN source material 7. The crucible contains at least one nucleation site in the first end configured for housing a growing crystal, and an AlN source material in the second end portion so that a PVT growth of AlN crystals is carried out through self-seeding. The crucible 6 in which the AlN source material is placed and the nucleation site is configured and the crystal boule growth takes place, and the axial thermal profile inside the crucible during crystal boule growth is schematically shown in FIG. 2. The crucible 6 contains source material 7 and empty first end 23 and empty crucible portion 24. The conical-shape inside surface of empty end 23 depicted in FIG. 2, is configured to be a nucleation site, and the empty crucible portion 24 is for housing a growing crystal boule. The axial thermal profile inside the crucible is schematically shown by plotted solid curve 25 of the temperature versus the vertical position along the axis of the crucible (Z). During crystal growth, the temperature at the nucleation site (first end 23), is maintained at $T^g_{nucleation}$, and the temperature of the surface of source material 7 facing the nucleation site is $T^g_{source}$. In accordance with the invention, $T^g_{source}$ is larger than $T^g_{nucleation}$ by the amount nominally in the range of 3 to 300° C., more preferably in the range of 5 to 150° C. Alternatively, the empty first end of the crucible can be configured to hold a seed made from AlN single crystals or SiC single crystals, in a seeded growth, and the seed is provided as one or more nucleation sites in this situation.

Figure 3:
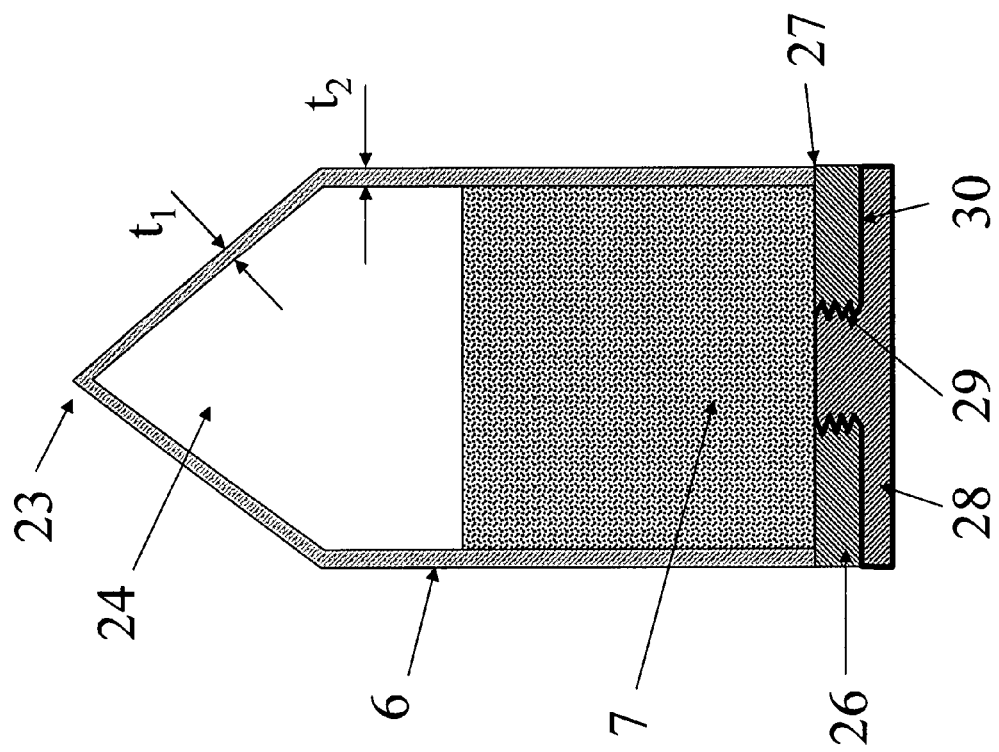
FIG. 3 is a cross sectional view of a thin-wall crucible for AlN crystal growth by self-seeding for a crystal boule grown in the top portion of the crucible.

Another aspect of the first embodiment is the materials from which, and the manner in which, the crucibles are made, shaped and configured for PVT growth of AlN single crystals. The crucible is made from a refractory metal, preferably tantalum (Ta) or niobium (Nb) of at least 99.9%, by weight, purity. The crucible is mechanically shaped or formed using a process such as, but not limited to, machining, welding, punching, deep drawing, forging, turning, milling, grinding, and polishing. The crucible is shaped or otherwise made in such way that the portion of the crucible including the first end for housing the growing AlN crystal has a thickness nominally in the range of 0.05 to 2 mm, more preferably in the range of 0.1 to 1 mm. To further illustrate this aspect, FIG. 3 shows schematically a crucible 6 with a conical shape end for self-seeded PVT growth. The portion including the conical first end 23 of the crucible is to house the growing crystal boule and the crucible wall thickness, as labeled by $t_1$ and $t_2$, is nominally in the range of 0.05 to 2 mm, more preferably in the range of 0.1 to 1 mm. The crucible 6 is made in such way that the crucible is substantially sealed using a mechanical seal at the second end so that excess loss of aluminum vapor from the crucible through the mechanical seal is minimized but in the meantime nitrogen gas is able to diffuse through the mechanical seal to maintain substantially the same pressure in the interior and the exterior of the crucible.

FIG. 3 schematically shows this aspect. The second end of the crucible 6 includes mating piece, 26, welded joint, 27, sealing piece, 28, threads, 29, and mating (sealing) joint, 30. The crucible made in this way allows the source materials to be filled into the crucible 6 before being placed in the PVT furnace for crystal growth. The crucible is made in such way that only the mating joint, 30, between the mating piece, 26, and the sealing piece, 28, is permeable to nitrogen gas, argon gas and aluminum vapor. The invention further teaches that the two mating components, i.e. mating piece, 26, and sealing piece, 28, of the crucible are machined such that the crucible is substantially sealed to the extent that excess loss of aluminum vapor from the crucible through mating joint, 30, is substantially prevented, and in the meantime nitrogen gas and argon gas are allowed to diffuse through mating joint, 30, so as to maintain substantially the same pressure in the interior and the exterior of the crucible. The substantially sealed crucible employed in this invention enables evacuation of the crucible to achieve a vacuum (a pressure less than 1 torr) before crystal growth so that oxygen gas in the interior of the crucible is substantially excluded. The substantially sealed crucible employed in this invention also allows control of nitrogen partial pressure in the interior of the crucible by regulating the system nitrogen partial pressure inside the growth chamber in a PVT furnace so that a vapor phase due to sublimation of AlN source material inside the crucible may be maintained to be nitrogen-rich, or substantially stoichiometric, or aluminum-rich, during a PVT growth.

Figure 4:
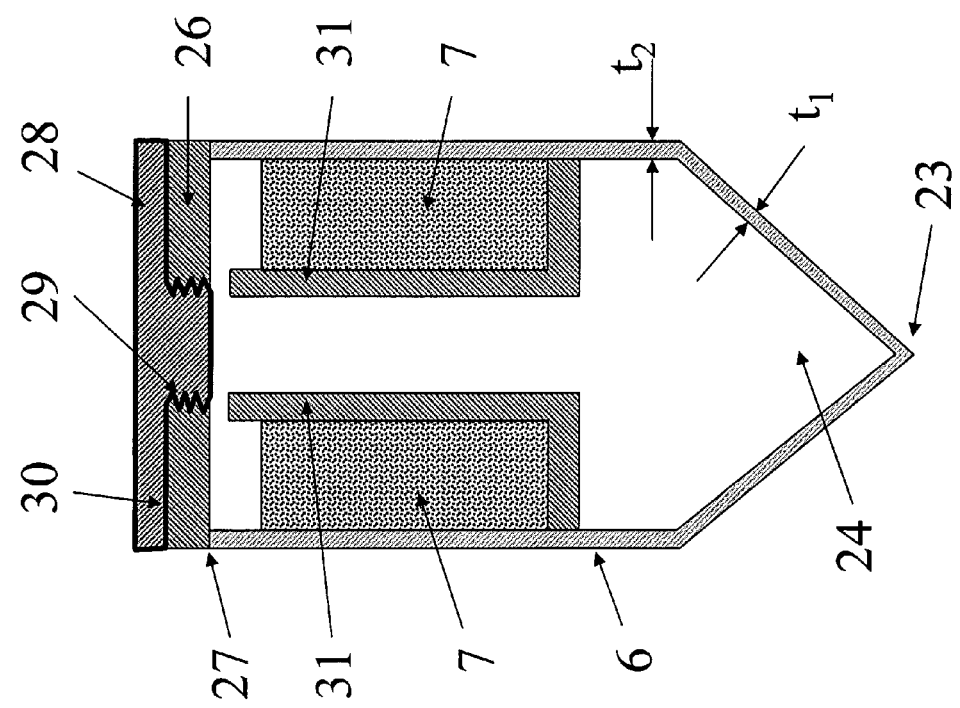
FIG. 4 is a cross sectional view of a thin-wall crucible for AlN crystal growth by self-seeding for a crystal boule grown in the bottom portion of the crucible.

The growth apparatus shown in FIG. 1 may be modified or changed within the scope of the present invention. For example, the thermal profile inside the crucible 6 can be generated in such way that the temperature of the bottom end of the crucible is lower than the temperature of the top end of the crucible so that a crystal boule can be grown on the bottom portion of the crucible. As another example, the growth apparatus shown in FIG. 1 in a vertical arrangement (the furnace center axis parallel to the gravity direction, or a vertical growth furnace) can be modified so that a growth furnace is in a horizontal arrangement (the furnace center axis perpendicular to the gravity direction, or a horizontal growth furnace) and the crystal boules is grown in the direction perpendicular to the gravity direction. Yet, another example is that the apparatus is configured to grow two AlN crystal boules in one crucible in a furnace in one growth run, and the two crystals boules produced together in one same crucible are substantially similar in shape, dimensions and crystal quality. The crucible 6 design shown in FIG. 3 may be modified or changed but still within the scope of the invention. A number of examples of variation of crucible designs are discussed as follows:

A first modification of the crucible 6 design is shown in cross section in FIG. 4. A powder holding piece 31 secures source material 7 so that a crystal boule can grown via self-seeding at the bottom portion 23 of the crucible in a vertical growth furnace.

Figure 5:
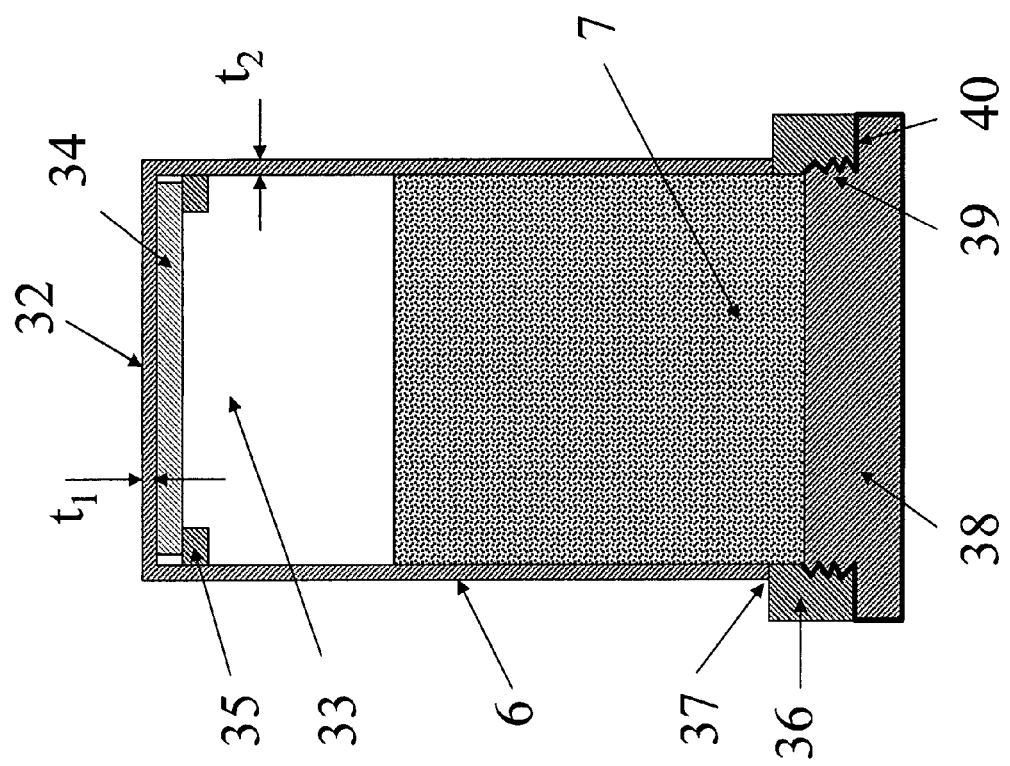
FIG. 5 is a cross sectional view of a thin-wall crucible for AlN crystal growth by AlN-seeding for an AlN seed loaded into the top end of the crucible.

A second modification is a crucible 6 shaped as shown in FIG. 5. Crystal (first) end 32 of the crucible, crucible end portion 33 and seed holder 34 are configured to hold seed 35 in place so that a seeded crystal growth in the top portion of the crucible may be performed. The crucible second end portion for housing source material 7 is made in such way that first mating piece 36, welded joint 37, second mating piece 38, threads 39 and mating joint, 40 substantially seal the crucible to the extent that excess loss of aluminum vapor from the crucible through mating joint 40 is substantially prevented, and in the meantime nitrogen gas and argon gas are able to diffuse through mating joint 40 to maintain substantially the same pressure in the interior and the exterior of the crucible.

Figure 6:
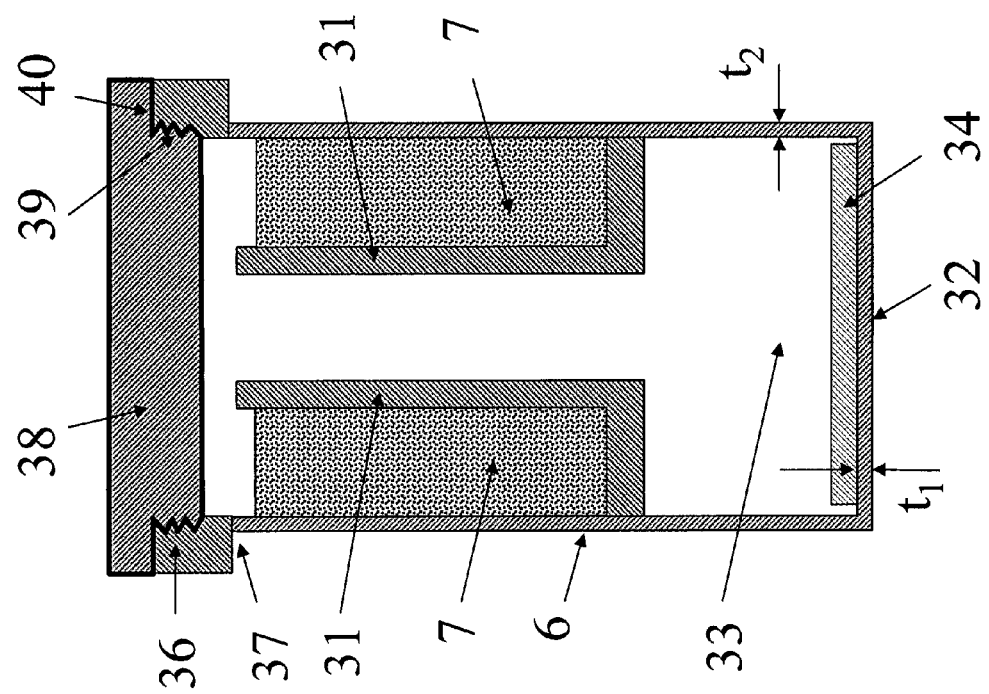
FIG. 6 is a cross sectional view of a thin-wall crucible for AlN crystal growth for an AlN seed loaded into the top end of the crucible.

The crucible 6 can be inverted as shown in FIG. 6, where crystal seed 35 is placed on the bottom end of the crucible, and source material 7 is held in place close to the end facing seed 35 by source holder 31 so that a crystal boule can be grown on seed crystal 35 at the bottom portion of the crucible in a vertical growth furnace.

Figure 7:
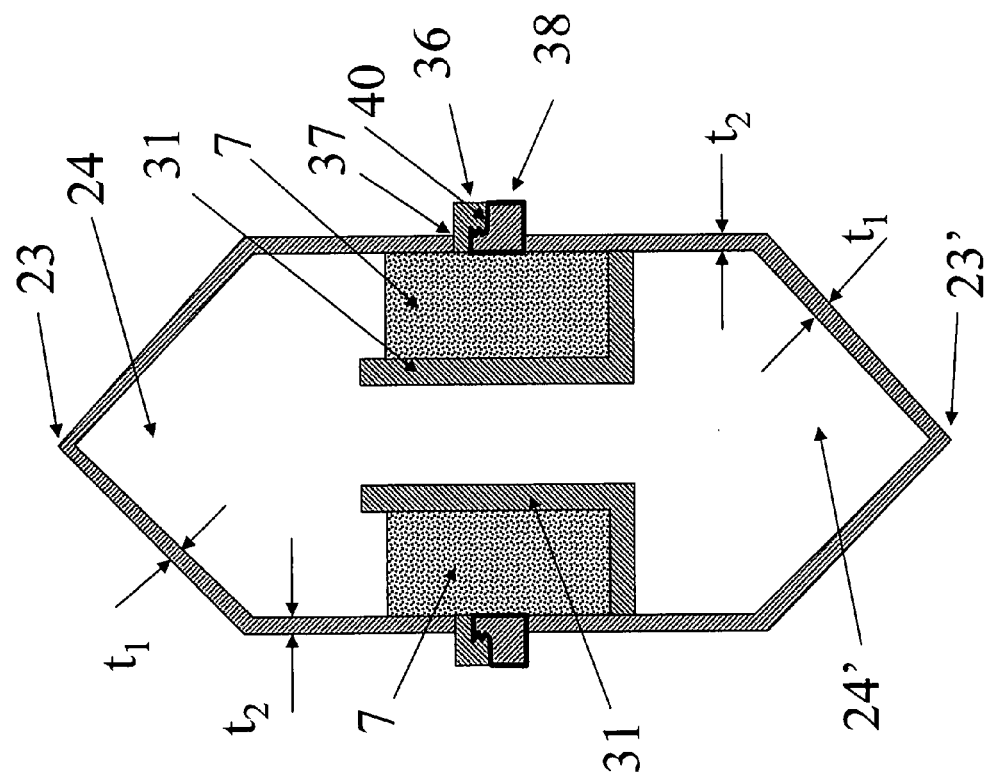
FIG. 7 is a cross sectional view of a thin-wall crucible for growing two AlN crystal boules in one crucible by self-seeding in a vertically arranged sublimation growth furnace.

A third modification is that the crucible 6 can be configured as shown in FIG. 7. The first end 23 and first end portion 24 of the crucible can hold a growing AlN single crystal boule, and second end 23' and second end portion 24' of the crucible can hold another growing AlN crystal boule; and source material 7 is placed in between the two end portions of the crucible so that two AlN single crystal boules can be grown at the same time in the crucible in a vertical growth furnace. The two crystal boules so grown in one crucible are substantially similar in physical shape, dimensions, and crystalline quality. The crucible middle portion for housing source material 7 is made in such way that first mating piece 36, welded joint 37, second mating piece 38, threads 39 and mating joint 40 substantially seal the crucible 6 to the extent that excess loss of aluminum vapor from the crucible through mating joint 40 is substantially prevented, and in the meantime nitrogen gas and argon gas are allowed to diffuse through mating joint 40 so as to maintain a substantially the same pressure in the interior and the exterior of the crucible.

Figure 8:
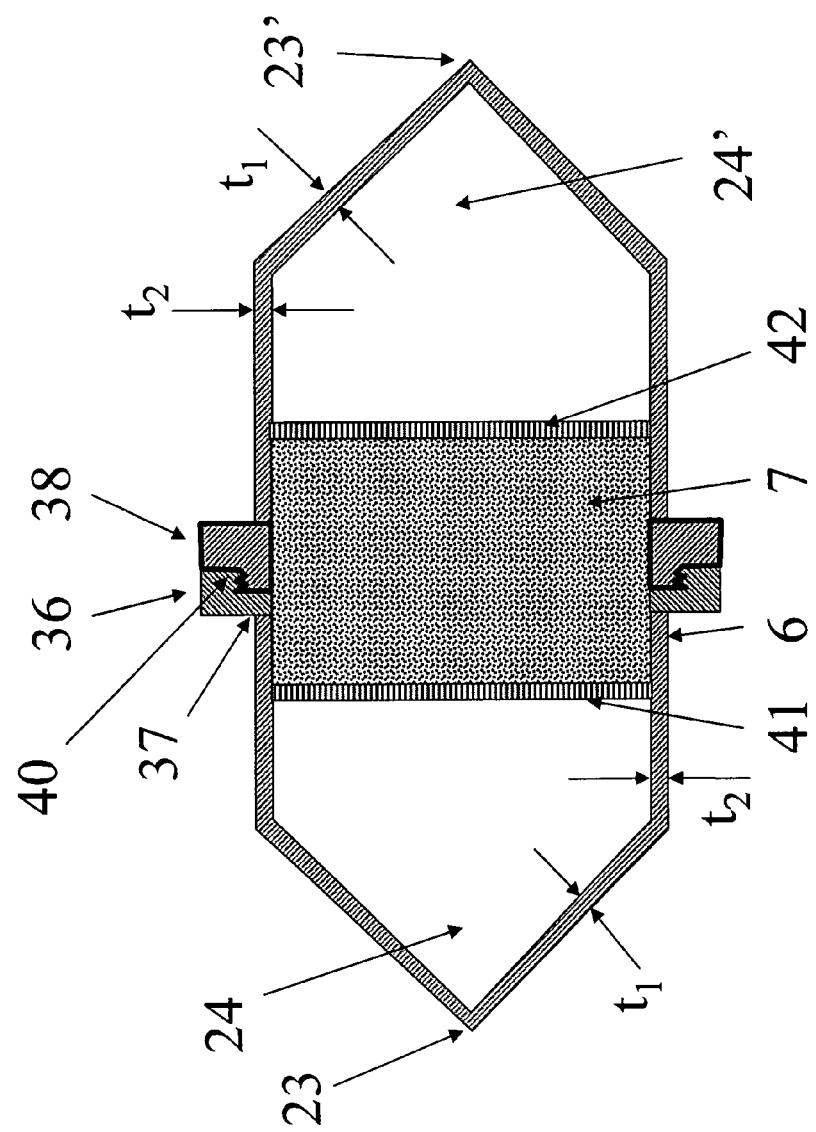
FIG. 8 is a cross sectional view of a thin-wall crucible for growing two AlN crystal boules in one crucible by self-seeding for a horizontally arranged sublimation growth furnace.

Alternatively, the crucible 6 may be configured as shown in FIG. 8. First end 23 and first end portion 24 of the crucible can hold a growing AlN single crystal boule, and second end 23' and second end portion 24' of the crucible can hold another growing AlN crystal boule; and source material 7 is placed between the two end portions of the crucible 6 and is held in place by two gas-permeable members 41, 42, so that two AlN single crystal boules can be grown at the same time in the crucible in a horizontal growth furnace. The two crystal boules so grown in one same crucible are substantially similar in physical shape, dimensions, and crystalline quality.

Figure 9:
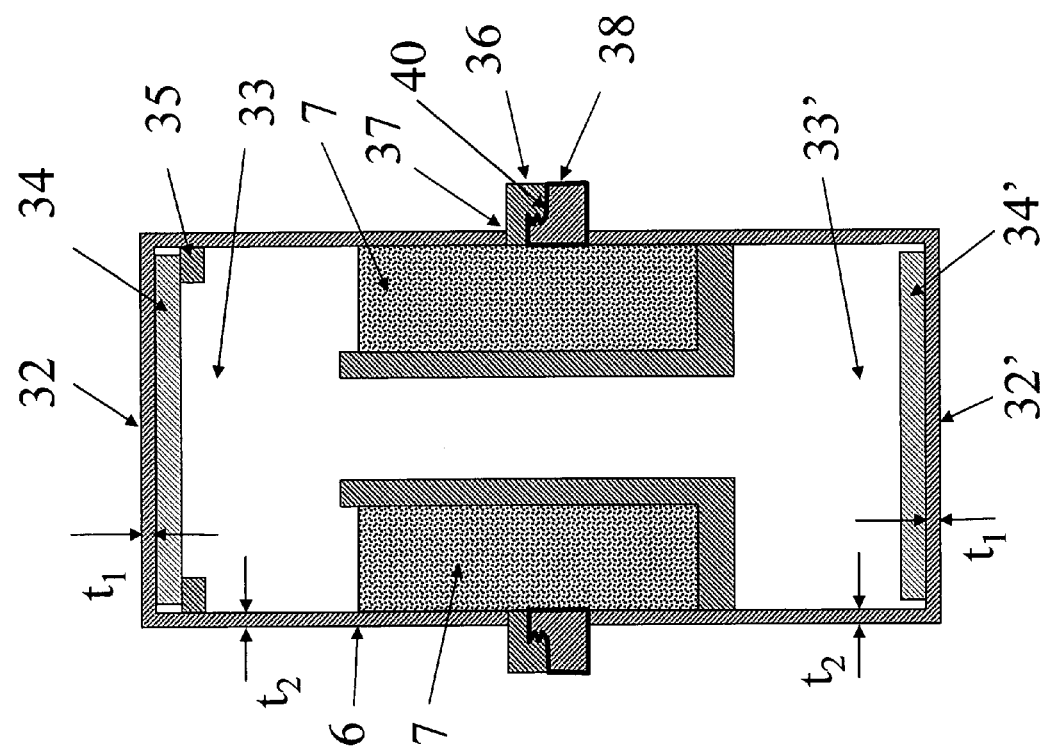
FIG. 9 is a cross sectional view of a thin-wall crucible for growing two AlN crystal boules in one crucible by AlN-seeding for a vertically arranged sublimation growth furnace.

A fourth modification is that the crucible 6 can be configured as shown in FIG. 9. First end 32 and first end portion 33 of the crucible and first seed holder 34 can hold seed 35 and a growing AlN single crystal boule. Second end 32' and second end portion 33' of the crucible and second seed holder 34' can house seed 35' and another growing AlN crystal boule. Source material 7 is held in place by source holder 31 in between the two end portions of the crucible so that two AlN single crystal boules can be grown on seed 35 and seed 35', respectively, at the same time in the crucible in a vertical growth furnace. The two crystal boules so grown in one same crucible are substantially similar in physical shape, dimensions, and crystalline quality.

Figure 10:
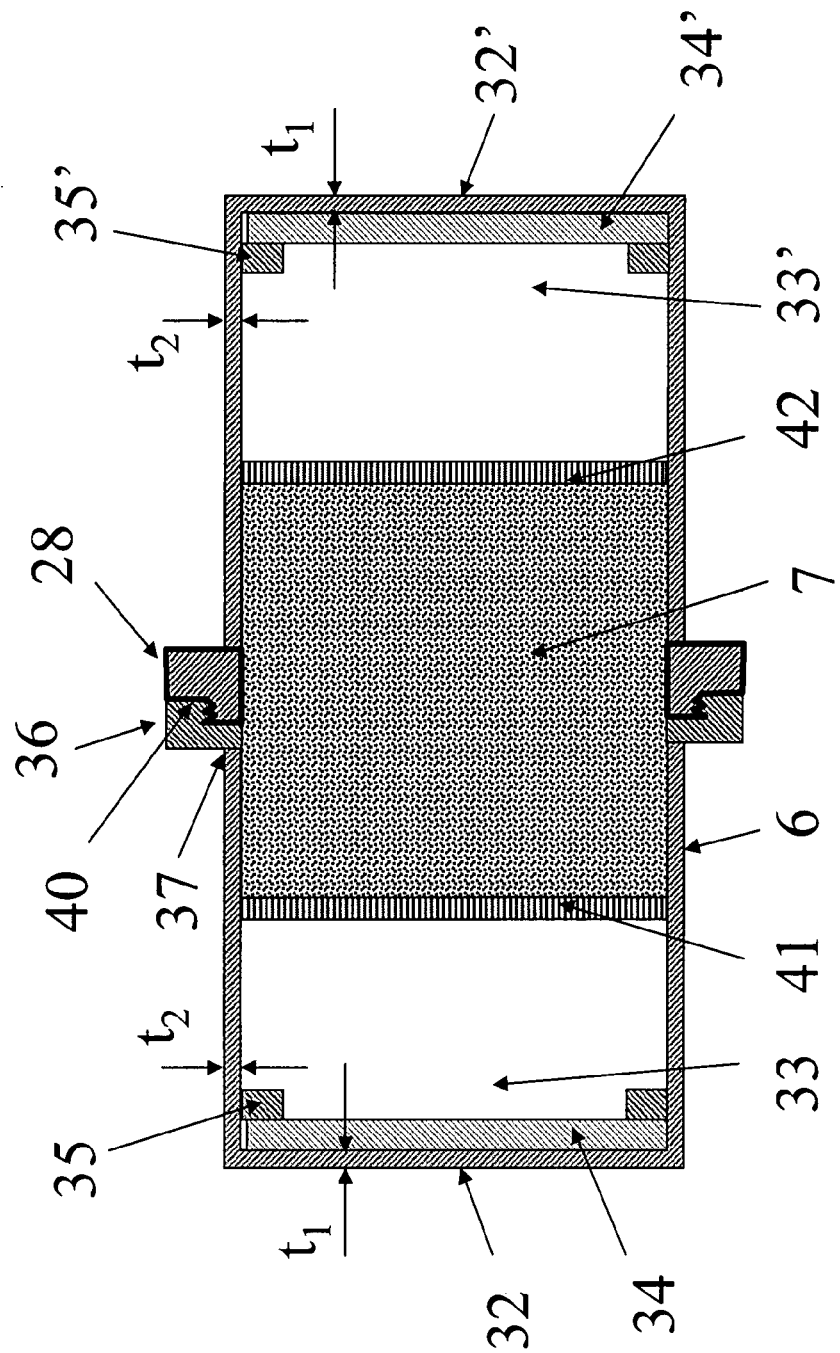
FIG. 10 is a cross sectional view of a thin-wall crucible for growing two AlN crystal boules in one crucible by AlN-seeding for a horizontally arranged sublimation growth furnace.

Alternately, the crucible 6 can be configured as shown in FIG. 10. First end 32 and first end portion 33 of the crucible 6 and seed holder 34 can house seed 35 and a growing AlN single crystal boule. Second end 32' and second end portion 34' of the crucible can house seed 35' and another growing AlN crystal boule. Source material 7 is placed in between the two end portions of the crucible and held in place by two gas-permeable members 41, 42, so that two AlN single crystal boules can be grown on seed 35 and seed 35', respectively, at the same time in the crucible in a horizontal growth furnace. The two crystal boules so grown in one same crucible are substantially similar in physical shape, dimensions, and crystalline quality.

Other aspects include at least one nucleation site is provided for PVT AlN single crystal growth. The nucleation site is the interior surface of a conical end of a crucible when self-seeding is employed to grow AlN single crystals. The nucleation site is one or more AlN single crystal seeds when a seeded growth is employed to grow AlN single crystals. Further, a PVT AlN single crystal may be grown from a vapor phase that is nitrogen-rich, or substantially stoichiometric, or aluminum-rich. An average growth rate in the invention is in the range of about 0.3 mm/hr to 2.5 mm/hr.

Another aspect is that the aforementioned crucible made of Ta metal is further treated before being used in PVT growth of AlN crystal so that at least one surface layer contains TaC in a high temperature carbonization process in a graphite-based furnace (i.e. with a graphite susceptor/heater and graphite thermal insulation). The high temperature carbonization process includes the following steps: (1) evacuating the furnace vessel to a system pressure of lower than 0.1 torr, (2) maintaining a furnace system pressure in the range of 100 torr to 760 torr by filling or flowing nitrogen gas, (3) heating an empty Ta crucible when only the exterior surface of the crucible is to be carbonized, or a Ta crucible filled with graphite chunks of sizes in the range of 1 mm to 5 mm when both exterior and interior surfaces are to be carbonized, to a crucible temperature in the range of 2200-2400° C. in about 3 to 6 hours, and maintaining the crucible temperature constant in the range of 2200-2400° C. for about 2 to 8 hours, and (4) cooling the furnace to room temperature. After the carbonization treatment, a TaC layer forms beginning at the exterior surface of the crucible or forms from both the exterior and interior surfaces of the crucible, or the entire crucible is converted into TaC. The crucible shape and physical dimensions are substantially unchanged before and after the carbonization process. The crucible after being treated in a carbonization process is used in AlN PVT growth in substantially the same way as a Ta crucible without being carbonized. A Nb crucible is treated in substantially the same carbonization process so that at least one surface layer of the crucible contains NbC.

In another embodiment, the aforementioned crucible made of Ta metal is treated so that at least one surface layer of the crucible contains TaN in a high temperature nitridation process in a non-graphite-based furnace (with graphite-free or carbon-free susceptor/heater and thermal insulation). The high temperature nitridation process includes the following steps: (1) evacuating the furnace vessel to a system pressure of lower than 0.1 torr, (2) maintaining a furnace system pressure in the range of 100 torr to 760 torr by filling or flowing nitrogen gas, (3) heating an empty Ta crucible to a crucible temperature in the range of 2200-2400° C. in about 3 to 6 hours, and maintaining the crucible temperature constant in the range of 2200-2400° C. for about 2 to 8 hours, and (4) cooling the furnace to room temperature. After the nitridation treatment, a TaN layer is formed from both the exterior and interior surfaces of the crucible or the entire crucible is converted into TaN. The crucible shape and physical dimensions are substantially unchanged before and after the nitridation process. The crucible containing TaN after being treated in the nitridation process is used in AlN PVT growth in substantially the same way as a Ta crucible without being treated in a nitridation process. A Nb crucible is treated in substantially the same nitridation process so that at least one surface layer of the crucible contains NbN.

Figure 11:
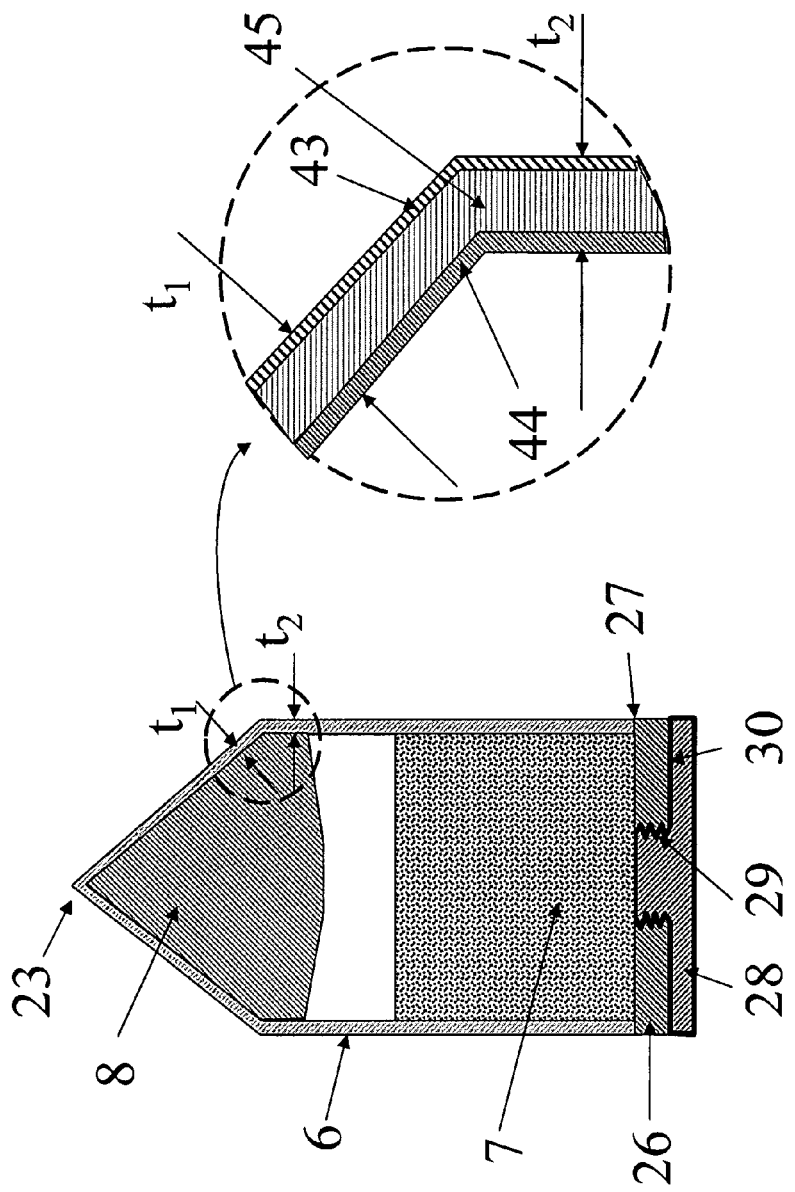
FIG. 11 is a schematic drawing of an expanded view of a portion of a thin wall crucible in contact with the crystal boule showing the inner surface, the outer surface and the interior of the crucible portion.

The layer structure in a crucible wall after carbonization or nitridation is shown in cross section in FIG. 11. A portion of a crucible (within a dashed circle) is expanded to show detail including exterior surface layer 43, interior surface layer 44 and middle layer 45. Using a nomenclature, exterior surface layer/middle layer/interior surface layer, to denote the material types in a crucible, possible combinations of material layers in a crucible wall after carbonization or nitridation include: TaC/Ta/Ta, TaC/Ta/TaC, TaC/TaC/TaC, TaC/Ta/TaN, TaC/TaC/TaN, TaC/TaN/TaN, TaN/TaN/TaN, NbC/Nb/Nb, NbC/Nb/NbC, NbC/NbC/NbC, NbC/Nb/NbN, NbC/NbC/NbN, NbC/NbN/NbN, and NbN/NbN/NbN.

Another aspect is that the average crystal growth rate in a PVT AlN crystal growth as a function of growth temperature and system nitrogen pressure follows a trend described by the following two Statements: (1) when the temperature difference between the source material and growing crystal, and the system nitrogen pressure are held constant, the growth rate of AlN crystal increases as the crystal temperature increases; and (2) when the temperatures of the source material and the growing crystal are held constant, the growth rate decreases as the system nitrogen pressure increases. Growth experiments conducted by the inventor of the present invention substantially validate these two statements.

Figure 12:
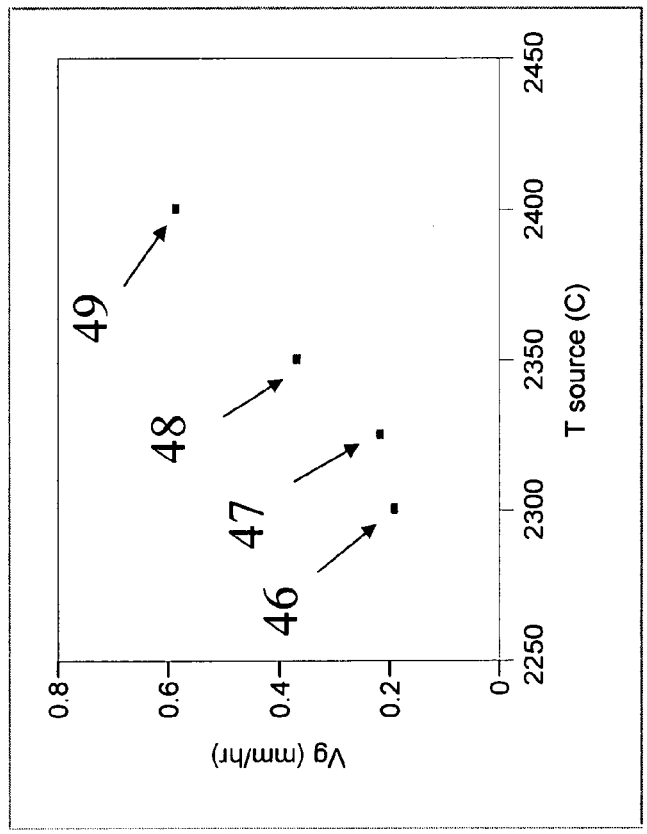
FIG. 12 is a plot of average crystal growth rate as a function of source temperature.

Corresponding to Statement (1), FIG. 12 shows a plot of four experimental data points, 46, 47, 48, 49, of average growth rate (Vg, in mm/hour) versus source temperature ($T_{source}$, in ° C.) in a series of PVT AlN growth experiments when the system nitrogen pressure was held constant at about 500 torr, which shows that the average growth rate increases as the source temperature increases.

Figure 13:
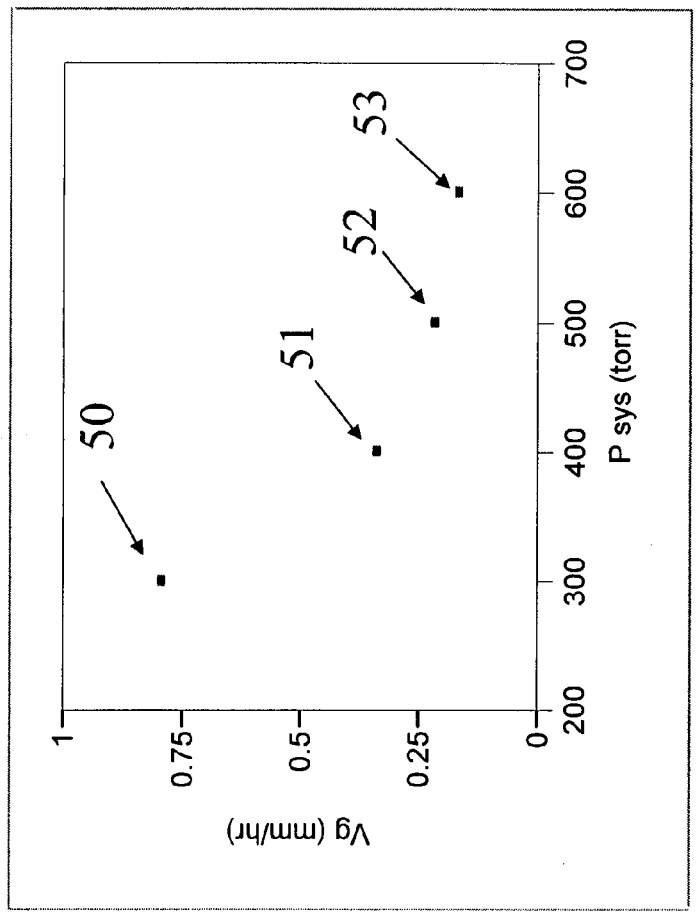
FIG. 13 is a plot of average crystal growth rate as a function of system nitrogen pressure.

Corresponding to Statement (2), FIG. 13 shows a plot of four experimental data points, 50, 51, 52, 53, of average growth rate (Vg, in mm/hour) versus source temperature ($T_{source}$, in ° C.) in a series of PVT AlN growth experiments when the temperatures of the source material and the growing crystal were held substantially constant at about 2350° C. and 2285° C., respectively, which shows that the average growth rate decreases quickly as the system nitrogen pressure increases.

The present invention utilizes the relationship between the growth rate and the source temperature or the system nitrogen pressure in the initiation of crystal growth in a PVT growth in one of the following two ways: (1) holding the system nitrogen pressure at a substantially constant value that is desirable for crystal growth, and then increasing the temperature of the source material in a slow, controlled manner so that the growth rate is increased from substantially zero to a desired growth rate; or (2) holding the system nitrogen pressure at value substantially higher than what is desired for crystal growth, ramp up the source temperature to a desired value for crystal growth, and then decreasing the system nitrogen pressure in a slow, controlled manner so that the growth rate is increased from substantially zero to a desired growth rate.

Another aspect includes a method for growing bulk single crystals of aluminum nitride by utilizing the aforementioned setup in a PVT growth furnace and the crucible for housing the source material and a growing AlN crystal. This method includes the following steps:

a.) placing a source material at a first end of a crucible and providing at least one nucleation site in the opposing end of the crucible enclosure with the nucleation site and the source material separated by a distance;

b.) evacuating the growth vessel to a pressure less than 0.1 torr;

c.) ramping up the system pressure and the crucible temperature to initiate crystal growth by following a predetermined growth initiation procedure so that, at the end of the growth initiation, the system pressure in the growth chamber is $P^g_{system}$ comprised of nitrogen and argon partial pressures, $P^g_{nitrogen}$ and $P^g_{argon}$ ($P^g_{system}=P^g_{nitrogen}+P^g_{argon}$) by filling or flowing nitrogen and argon gases, the temperature of the source material is at $T^g_{source}$, and the temperature of the nucleation site is at $T^g_{nucleation}$, and $T^g_{source}$ is larger than $T^g_{nucleation}$;

d.) maintaining a substantially constant system pressure, $P^g_{system}$, comprised of nitrogen and argon partial pressures, $P^g_{nitrogen}$ and $P^g_{argon}$ ($P^g_{system}=P^g_{nitrogen}+P^g_{argon}$) by filling or flowing nitrogen and argon gases;

e.) maintaining a temperature distribution within the crucible enclosure in such way the temperature of the source material, $T^g_{source}$, is higher than the temperature of the crystal surface of the growing AlN single crystal facing the source material, thereby causing continuing growth of AlN single crystals; and f.) cooling the furnace to room temperature.

Figure 14:
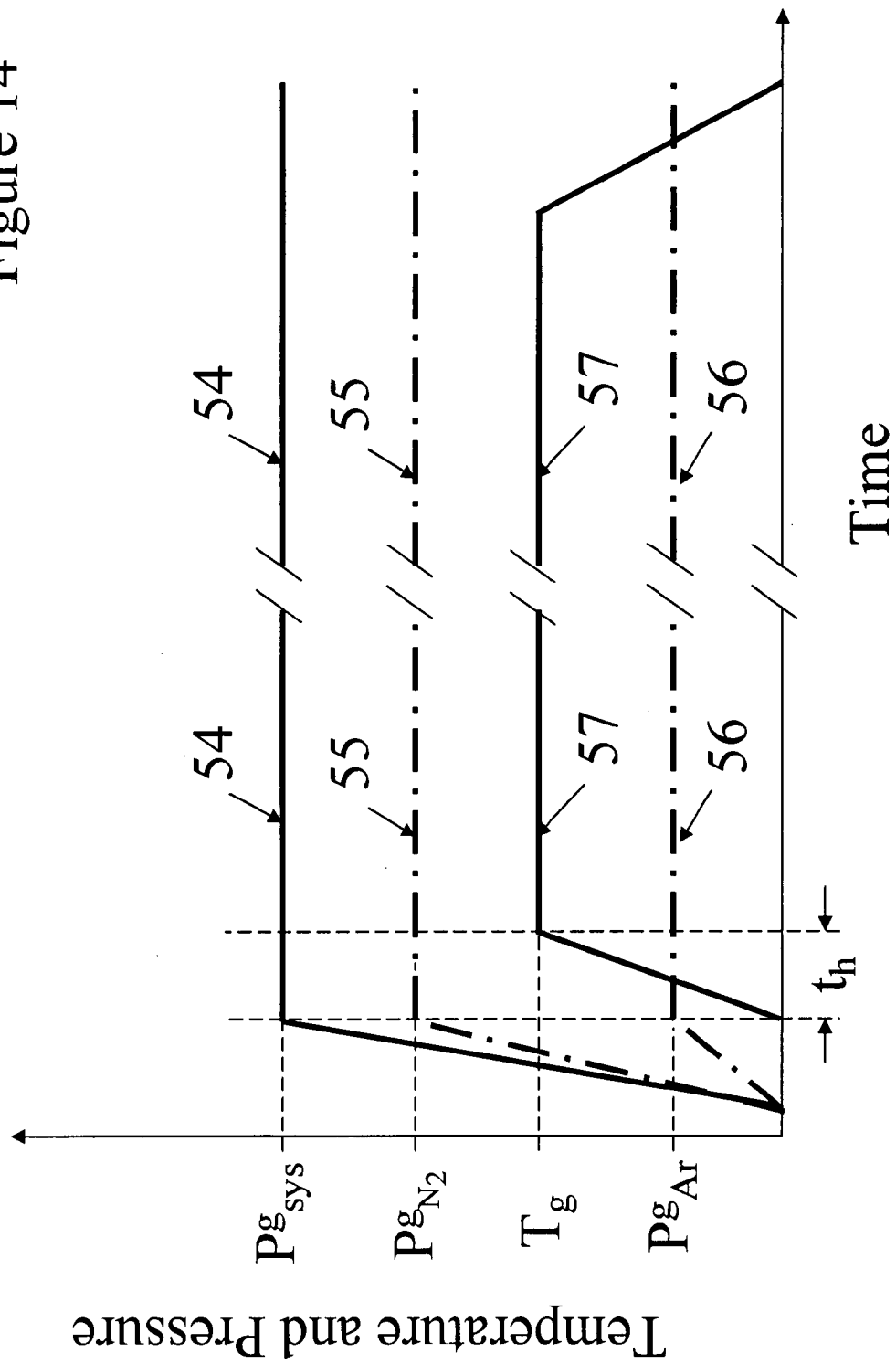
FIG. 14 is a schematic chart showing select growth parameters used in the instant process when a growth temperature ramp-up is used in growth initiation.

The growth initiation in Step c.) is as follows: ramping the system pressure to $P^g_{system}$ in a period of time of about 0.5 to 2 hours and then heating the crucible so that the temperature of the source material reaches $T^g_{source}$ and the temperature of the nucleation site reaches $T^g_{nucleation}$, where $T^g_{source}$ is larger than $T^g_{nucleation}$, in a time period in the range of about 3 hours to 10 hours while maintaining the system pressure substantially constant at $P^g_{system}$ that substantial growth of AlN crystals on the nucleation site or sites is initiated. FIG. 14 is a plot of total system pressure curve, 54, system nitrogen partial pressure curve, 55, system argon partial pressure curve, 56, growth temperature curve, 57, versus time in a PVT growth run using a temperature ramp in growth initiation. The growth temperature is measured at one end of the crucible so that the temperature of the source material, $T^g_{source}$, and the temperature of nucleation site, $T^g_{nucleation}$, can be achieved and maintained. The time interval, $t_h$, is the time to ramp up the growth temperature from room temperature to growth temperature so that the temperature of the source material reaches $T^g_{source}$ and the temperature of the nucleation site reaches $T^g_{nucleation}$, where $T^g_{source}$ is larger than $T^g_{nucleation}$, and the value of $t_h$ is in the range of 3 hours to 10 hours. At any time during a growth, the system pressure in a PVT growth furnace consists of the nitrogen partial pressure, $P_{nitrogen}$, and the argon pressure, $P_{argon}$, and $P_{system}=P_{nitrogen}+P_{argon}$, i.e. the value of the total system pressure on curve, 54, equals to the sum of the value of the nitrogen partial pressure on curve, 55, and the value of the argon partial pressure on curve, 56, which is achieved by setting flow rates of nitrogen and argon gases.

Alternatively, the growth initiation in Step c.) is as follows: ramping the system pressure to $P^i_{system}$ ($P^i_{system}$ is at least 100 torr higher than $P^g_{system}$) in a period of time of about 0.5 to 2 hours, and heating the crucible so that the temperature of the source material reaches $T^g_{source}$ and the temperature of the nucleation site reaches $T^g_{nucleation}$, where $T^g_{source}$ is larger than $T^g_{nucleation}$, in a time period in the range of about 2 hours to about 4 hours while maintaining the system pressure substantially constant at $P^i_{system}$, and then decreasing the system pressure from $P^i_{system}$ to a value of $P^g_{system}$ in a time period of 3 to 8 hours so that substantial growth of AlN crystals on the nucleation site or sites is initiated. FIG. 15 is a plot of total system pressure curve, 58, system nitrogen partial pressure curve, 59, system argon partial pressure curve, 60, growth temperature curve, 61, versus time in a PVT growth run using a nitrogen pressure ramp in growth initiation. The time interval, $t_p$, is the time period in which the system pressure is decreased from $P^i_{system}$ to a value of $P^g_{system}$ in growth initiation, and the value of $t_p$ is in the range of 3 hours to 8 hours. At any time during a growth, the system pressure in a PVT growth furnace consists of the nitrogen partial pressure, $P_{nitrogen}$, and the argon pressure, $P_{argon}$, and $P_{system}=P_{nitrogen}+P_{argon}$, i.e. the value of the total system pressure on curve, 58, equals to the sum of the value of the nitrogen partial pressure on curve, 59, and the value of the argon partial pressure on curve, 60, which is achieved by setting flow rates of nitrogen and argon gases. The growth temperature is measured at one end of the crucible so that the temperature of the source material, $T^g_{source}$, and the temperature of nucleation site, $T^g_{nucleation}$, can be achieved and maintained.

The aforementioned system pressure $P^g_{system}$ is in the range of about 300 torr to 2800 torr and $P^i_{system}$ is in the range of about 400 torr to 2900 torr. The partial pressures of nitrogen and argon corresponding to $P^g_{system}$ and $P^i_{system}$ are in the ranges as follows:

$P^g_{nitrogen}$ is about 300 torr to 2000 torr, and $P^g_{Argon}$ is about 0 torr to 800 torr;

$P^i_{nitrogen}$ is about 400 torr to 2100 torr, and $P^g_{Argon}$ is about 0 torr to 800 torr; and $P^i_{nitrogen}$ is larger than $P^g_{nitrogen}$ by the amount of in the range of about 100 torr to 1500 torr.

An argon gas is used to reduce degradation of graphite parts inside the growth furnace and hence to increase lifetime of the graphite parts and the aforementioned growth temperatures are as follows:

$T_{source}$ is nominally in the range of 2000-2500° C., more preferably in the range of 2150-2450° C., $T_{nucleation}$ is nominally in the range of 2000-2500° C., more preferably in the range of 2150-2450° C., and $T_{source}$ is larger than $T_{nucleation}$ by the amount nominally in the range of about 3° C. to 300° C., more preferably in the range of 10° C. to 200° C.

Another aspect is that a PVT AlN single crystal may be grown from a vapor phase that is nitrogen-rich, or substantially stoichiometric, or aluminum-rich. An average growth rate in the invention is in the range of 0.3 mm/hr to 2.5 mm/hr.

In another embodiment, the aforementioned crucible made of Ta metal is further treated before being used in PVT growth of AlN crystal so that at least one surface layer contains TaC in a high temperature carbonization process in a graphite-based furnace (i.e. with a graphite susceptor/heater and graphite thermal insulation). The high temperature carbonization process includes the following steps: (1) evacuating the furnace vessel to a system pressure of lower than 0.1 torr, (2) maintaining a furnace system pressure in the range of 100 torr to 760 torr by filling or flowing nitrogen gas, (3) heating an empty Ta crucible when only the exterior surface of the crucible is to be carbonized, or a Ta crucible filled with graphite chunks of sizes in the range of 1 mm to 5 mm when both exterior and interior surfaces are to be carbonized, to a crucible temperature in the range of 2200-2400° C. in about 3 to 6 hours, and maintaining the crucible temperature constant in the range of 2200-2400° C. for about 2 to 8 hours, and (4) cooling the furnace to room temperature. After the carbonization treatment, a TaC layer of golden yellow appearance forms beginning at the exterior surface of the crucible or forms from both the exterior and interior surfaces of the crucible, or the entire crucible is converted into TaC. The crucible shape and physical dimensions are substantially unchanged before and after the carbonization process. The crucible after being treated in a carbonization process is used in AlN PVT growths in substantially the same way as a Ta crucible without being carbonized. A crucible made of Nb metal is treated in substantially the same carbonization process so that at least one surface layer of the crucible contains NbC.

In still another embodiment, the aforementioned crucible made of Ta metal is further treated so that at least one surface layer of the crucible contains TaN in a high temperature nitridation process in a non-graphite-based furnace (with graphite-free or carbon-free susceptor/heater and thermal insulation). The high temperature nitridation process includes the following steps: (1) evacuating the furnace vessel to a system pressure of lower than 0.1 torr, (2) maintaining a furnace system pressure in the range of 100 torr to 760 torr by filling or flowing nitrogen gas, (3) heating an empty Ta crucible to a crucible temperature in the range of 2200-2400° C. in about 3 to 6 hours, and maintaining the crucible temperature constant in the range of 2200-2400° C. for about 2 to 8 hours, and (4) cooling the furnace to room temperature. After the nitridation treatment, a TaN layer forms from both the exterior and interior surfaces of the crucible, or the entire crucible is converted into TaN. The crucible shape and physical dimensions are substantially unchanged before and after the nitridation process. The crucible containing TaN after being treated in the nitridation process is used in AlN PVT growth in substantially the same way as a Ta crucible without being treated in a nitridation process. A crucible made of Nb metal is treated in substantially the same nitridation process so that at least one surface layer of the crucible contains NbN.

In another embodiment, thermal insulation 3 in FIG. 1 may be modified and crucible 6 placed on a movable platform in such way that crucible 6 can be traversed upward or downward in a vertical furnace or left or right in a horizontal furnace through a thermal gradient. Growth can be initiated and maintained by traversing the crucible with respect the susceptor (heater) and thermal insulation through a thermal gradient.

The susceptor may be made of tantalum or tantalum carbide or nitride or a composite of the following: TaC, Nb, NbC TaN, NbN, of at least 99.9% purity and the thermal insulation may be made of one of more kinds of Ta, TaC, Nb, NbC, TaN, NbN, in powder form or sheet form, of at least 99.9% purity.

Another aspect of the invention is that an $Al_xGa_{1-x}N$ bulk single crystal, where the value of x is in the range of 0.1 to 1.0, is grown using substantially the same aforementioned growth setup, crucible and growth procedure.

AlN single crystal boules grown inside a crucible can be retrieved so that the boules can be sliced into crystals wafers or samples in one of the following three ways: (1) slicing the crystal boule as-is, i.e. without separating the crystal boule and the crucible material housing the crystal boule from the crystal boule; (2) separating a crystal boule from the crucible housing a crystal boule without breaking the crucible; and (3) removing the crucible material housing a crystal boule by grinding away or breaking away mechanically.

Another aspect is that the PVT growth process is used for growth of one or more single crystal layers of AlN, or $Al_xGa_{1-x}N$, where the value of x is in the range of 0.1 to 1.0 and the crystal is grown using substantially the same aforementioned growth setup, crucible and growth procedure, on an AlN substrate or other substrates, including but not limited to substrates such as SiC or Sapphire ($Al_2O_3$), using essentially the same growth procedure, except the source temperature is in the range of 1800° C. to 2300° C. and the system nitrogen pressure is in the range of about 50 torr to 1500 torr, and each of the crystal layers grown has a thickness in the range of about 1 micrometer and 1000 micrometers.

The invention may be better understood by the following examples.

EXAMPLES

Example 1

AlN polycrystalline powder of about 30 g was placed into a crucible made of tantalum metal with a wall thickness of about 1 mm to 2 mm. The crucible with AlN powder was placed into an inductively heated PVT growth furnace with a graphite susceptor and graphite-fiber-based thermal insulation. The crystal growth was carried out in the following steps:
- a). evacuating the PVT growth chamber to a pressure less than 0.1 torr;
- b). ramping up the system nitrogen pressure to 500 torr by flowing a nitrogen gas into the furnace chamber;
- c). heating the crucible containing the AlN source material to a source material temperature of about 2325° C. and a temperature of the crystal end of the crucible of 2250° C. in about a time period of about 4.5 hours;
- d). maintaining the system nitrogen pressure, the source temperature, and the temperature of the crystal end of the crucible substantially constant at about 500 torr, 2325° C., and 2250° C., respectively, for about 17 hours;
- e). ramping down the temperature of the source material to 1000° C. in about 2 hours while maintaining the system nitrogen pressure at 500 torr; and
- f). turning off power supply to allow the furnace cool to room temperature.

After growth, the exterior surface of the crucible was found to be turned into TaC of golden yellow appearance, and there were no cracks or deformations observed in the crucible. The crystal boule was retrieved by partially breaking the tantalum crucible. An AlN crystalline boule was grown and it was attached to the crystal end of the crucible. The color of the crystal boule was amber, which is similar to the color of AlN crystalline boules grown under similar growth conditions in crucibles made of tungsten metal. The crystal boule measured about 20 mm in diameter and 8.0 mm in length, and therefore an average growth rate of 0.47 mm/hr was achieved.

Example 2

To demonstrate growth of an AlN crystalline boule in a crucible made from tantalum and subsequently carbonized at both the interior and exterior surfaces, a tantalum crucible with a wall thickness of about 1 mm to 2 mm in the portion for housing the crystal boule was fully filled with a graphite powder of 1 mm to 4 mm in chunks, and then placed into an inductively heated PVT growth furnace with a graphite susceptor and graphite-fiber-based thermal insulation for a carbonization run. The carbonization procedure was as follows:
- i. evacuating the PVT growth chamber to a pressure less than 0.1 torr;
- ii. ramping up the system nitrogen pressure to 500 torr by flowing a nitrogen gas into the furnace chamber;
- iii. heating the tantalum crucible containing filled with graphite powder to a temperature at the bottom end of the crucible of about 2300° C. in a time period of about 3.5 hours;
- iv. maintaining the system nitrogen pressure and the temperature of the crystal end of the crucible substantially constant at 500 torr and 2300° C., respectively, for about 3 hours;
- v. ramping down the temperature of the crucible to 1000° C. in about 2 hours while maintaining the system nitrogen pressure at 500 torr; and
- vi. turning off power supply to allow the furnace cool to room temperature.

After the carbonization process, both the interior and the exterior surfaces of the crucible were found to be turned into TaC of golden yellow appearance, and there were no cracks and deformations observed in the crucible. The crucible was then used for carrying out an AlN crystal growth.

About 30 grams of AlN polycrystalline powder was placed into the TaC crucible converted from a Ta crucible. The crucible with AlN powder was placed into an inductively heated PVT growth furnace with a graphite susceptor and graphite-fiber-based thermal insulation. The crystal growth was carried out in the following steps:
- a). evacuating the PVT growth chamber to a pressure less than 0.1 torr;
- b). ramping up the system nitrogen pressure to 500 torr by flowing a nitrogen gas into the furnace chamber;
- c). heating the crucible containing the AlN source material to a source material temperature of about 2350° C. and a temperature of the crystal end of the crucible of 2275° C. in a time period of about 4.5 hours;
- d). maintaining the system nitrogen pressure, the source temperature, and the temperature of the crystal end of the crucible substantially constant at about 500 torr, 2350° C., and 2275° C., respectively, for about 20 hours;
- e). ramping down the temperature of the source material to 1000° C. in about 2 hours while maintaining the system nitrogen pressure at 500 torr; and
- f). turning off power supply to allow the furnace cool to room temperature.

After growth, there were no cracks or deformations observed in the crucible. The crystal boule was retrieved by partially breaking the crucible. An AlN crystalline boule was grown and it was attached to the crystal end of the crucible. The color of the crystal boule was dark amber, which is similar to the color of AlN crystalline boules grown under similar growth conditions in crucibles made of tungsten metal. The crystal boule measured about 20 mm in diameter and 13 mm in length, and an average growth rate of 0.65 mm/hr was achieved in this growth.

One or more embodiments of the present invention have been described. Nevertheless, it will be understood that various modifications may be made without departing from the spirit and scope of the invention. Accordingly, other embodiments are within the scope of the following claims.

What is claimed is:

1. A crystal growth setup within a physical vapor transport growth furnace system for producing AlN monocrystal boules at high temperatures, comprising:
   a. a crucible effective to contain an AlN source material and a growing AlN crystal boule, said crucible having a thin wall thickness in at least that portion housing said growing AlN crystal boule;
   b. a mechanical seal sealing an end piece to said crucible, said mechanical seal effective to substantially prevent aluminum vapor diffusion while enabling nitrogen and argon diffusion to thereby maintain a substantially uniform total pressure in the interior and the exterior of said crucible;
   c. a susceptor, in case of an inductive heating, or a heater, in case of a resistive heating, made from a material selected from the group consisting of purified graphite solid with an ash content <50 ppm tantalum, tantalum carbide, tantalum nitride, niobium carbide and niobium nitride, all with a purity, by weight, >99.9%;
   d. a thermal insulation enclosing said susceptor or heater effective to provide a thermal gradient inside said crucible in the range of 5-100° C./cm, said thermal insulation being a material selected from the group consisting of graphite thermal insulation, rigid or flexible graphite fiber insulation and graphite powder, all with ash content >100 ppm, Ta, TaC, Nb, NbC, TaN, NbN powders, all with a purity, by weight, >99.9; and
   e. a furnace chamber capable of being operated from a vacuum (<0.1 torr) to a gas pressure of at least 4000 torr through filling or flowing a nitrogen gas or a mixture of nitrogen gas and argon gas.

2. A crystal growth setup within a physical vapor transport growth furnace system for producing AlN monocrystal boules at high temperatures, comprising:
   (a) a crucible effective to contain an AlN source material and having first and second end pieces, each end piece containing at least one nucleation site effective to contain a growing AlN crystal boule so that a minimum of two AlN crystal boules are grown in a single PVT growth run, said crucible having a thin wall thickness in at least those portions housing said growing AlN crystal boule;
   (b) a mechanical seal sealing one end piece of said crucible, said mechanical seal effective to substantially prevent aluminum vapor diffusion while enabling nitrogen and argon diffusion to thereby maintain a substantially uniform total pressure in the interior and the exterior of said crucible;
   (c) a susceptor, in case of an inductive heating, or a heater, in ease of a resistive heating;
   (d) a thermal insulation enclosing said susceptor or heater effective to provide a thermal gradient inside said crucible in the range of 5-100° C./cm; and
   (e) a furnace chamber capable of being operated from a vacuum (<0.1 torr) to a gas pressure of at least 4000 torr through filling or flowing a nitrogen gas or a mixture of nitrogen gas and argon gas.

* * * * *